(12) United States Patent
Yu et al.

(10) Patent No.: US 10,354,956 B1
(45) Date of Patent: Jul. 16, 2019

(54) THREE-DIMENSIONAL MEMORY DEVICE CONTAINING HYDROGEN DIFFUSION BARRIER STRUCTURES FOR CMOS UNDER ARRAY ARCHITECTURE AND METHOD OF MAKING THE SAME

(71) Applicant: SANDISK TECHNOLOGIES LLC, Plano, TX (US)

(72) Inventors: Jixin Yu, San Jose, CA (US); Daxin Mao, Cupertino, CA (US); Hiroyuki Ogawa, Yokkaichi (JP); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/863,205

(22) Filed: Jan. 5, 2018

(51) Int. Cl.
*H01L 27/28* (2006.01)
*H01L 23/535* (2006.01)
*H01L 27/11556* (2017.01)
*H01L 27/11582* (2017.01)
*H01L 27/11524* (2017.01)
*H01L 27/1157* (2017.01)
*H01L 23/528* (2006.01)
(Continued)

(52) U.S. Cl.
CPC ...... *H01L 23/535* (2013.01); *H01L 21/31053* (2013.01); *H01L 21/76846* (2013.01); *H01L 21/76895* (2013.01); *H01L 21/823475* (2013.01); *H01L 23/528* (2013.01); *H01L 23/5226* (2013.01); *H01L 23/53266* (2013.01); *H01L 27/1157* (2013.01); *H01L 27/11524* (2013.01); *H01L 27/11556* (2013.01); *H01L 27/11582* (2013.01); *H01L 29/04* (2013.01)

(58) Field of Classification Search
CPC ......... H01L 29/41766; H01L 29/66719; H01L 27/11529
See application file for complete search history.

(56) References Cited

U.S. PATENT DOCUMENTS 5,915,167 A   6/1999 Leedy
8,847,302 B2  9/2014 Alsmeier et al.
(Continued)

OTHER PUBLICATIONS

U.S. Appl. No. 15/418,989, filed Jan. 30, 2017, SanDisk Technologies LLC.
(Continued)

*Primary Examiner* — Jaehwan Oh
(74) *Attorney, Agent, or Firm* — The Marbury Law Group PLLC

(57) ABSTRACT

A contact level silicon oxide layer and a silicon nitride layer is formed over a semiconductor device on a semiconductor substrate. A contact via cavity extending to the semiconductor device is formed. A lower contact via structure portion is formed and recessed between top and bottom surface of the silicon nitride layer. An upper contact via structure portion including a hydrogen diffusion barrier material is formed in a remaining volume of the contact via cavity to provide a contact via structure. A three-dimensional memory array is formed over the silicon nitride layer. Metal interconnect structures are formed to provide electrical connection between the contact via structure and a node of the three-dimensional memory array. The hydrogen diffusion barrier material and the silicon nitride layer block downward diffusion of hydrogen.

12 Claims, 37 Drawing Sheets

(51) Int. Cl.
*H01L 21/3105* (2006.01)
*H01L 23/532* (2006.01)
*H01L 29/04* (2006.01)
*H01L 21/768* (2006.01)
*H01L 21/8234* (2006.01)
*H01L 23/522* (2006.01)

(56) References Cited

U.S. PATENT DOCUMENTS

| | | | |
|---|---|---|---|
| 9,559,117 | B2 | 1/2017 | Pachamuthu et al. |
| 2016/0180929 | A1* | 6/2016 | Kang ................. G11C 13/0004 365/63 |
| 2017/0373079 | A1 | 12/2017 | Sharangpani et al. |
| 2017/0373197 | A1 | 12/2017 | Sharangpani et al. |
| 2018/0240846 | A1* | 8/2018 | Choi ................... H01L 27/285 |

OTHER PUBLICATIONS

U.S. Appl. No. 15/434,544, filed Feb. 16, 2017, SanDisk Technologies LLC.
U.S. Appl. No. 15/458,200, filed Mar. 14, 2017, SanDisk Technologies LLC.
U.S. Appl. No. 15/458,269, filed Mar. 14, 2017, SanDisk Technologies LLC.
U.S. Appl. No. 15/458,272, filed Mar. 14, 2017, SanDisk Technologies LLC.
U.S. Appl. No. 15/581,575, filed Apr. 28, 2017, SanDisk Technologies LLC.
U.S. Appl. No. 15/593,916, filed May 12, 2017, SanDisk Technologies LLC.
U.S. Appl. No. 15/605,204, filed May 25, 2017, SanDisk Technologies LLC.
U.S. Appl. No. 15/638,672, filed Jun. 30, 2017, SanDisk Technologies LLC.

* cited by examiner

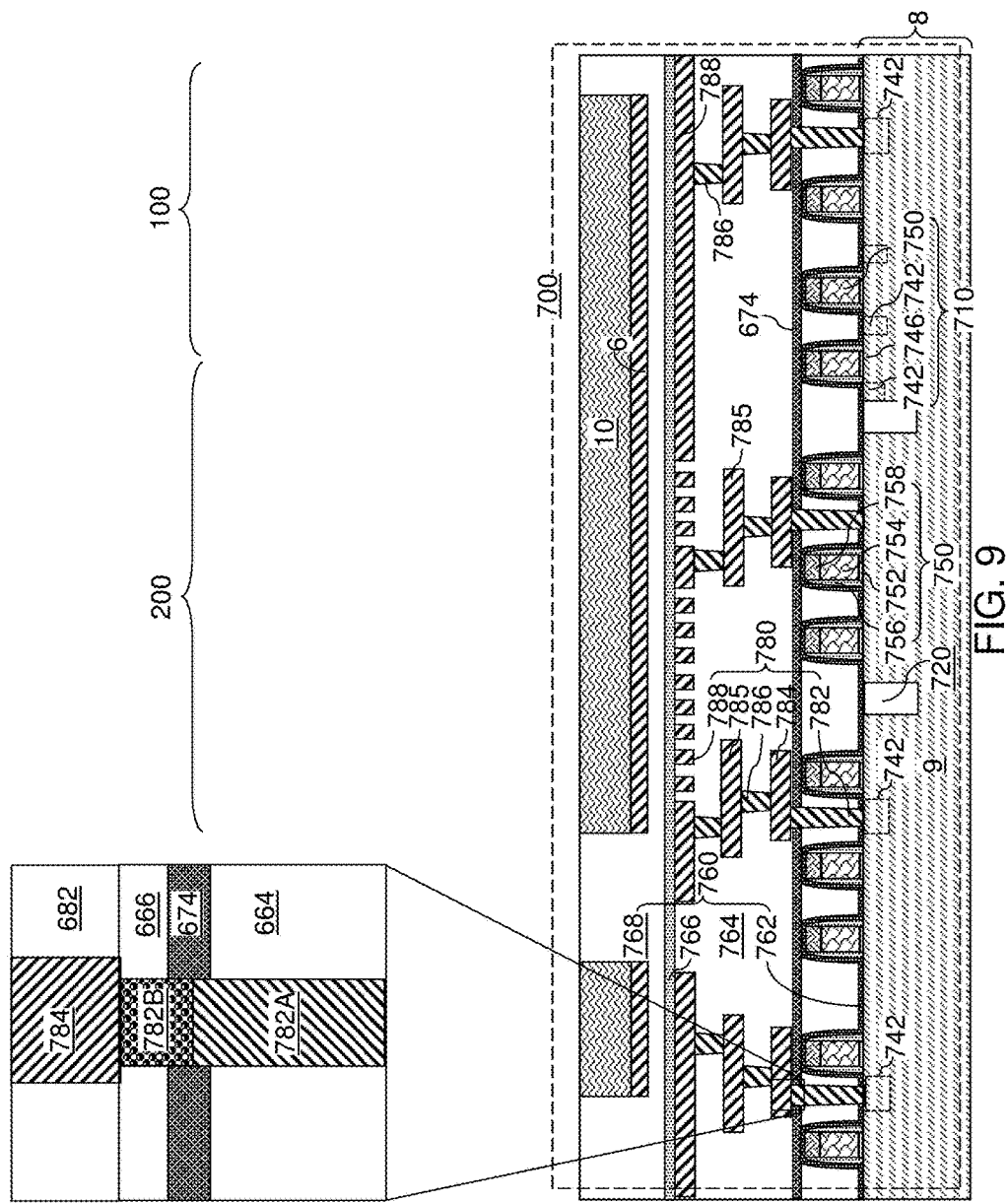

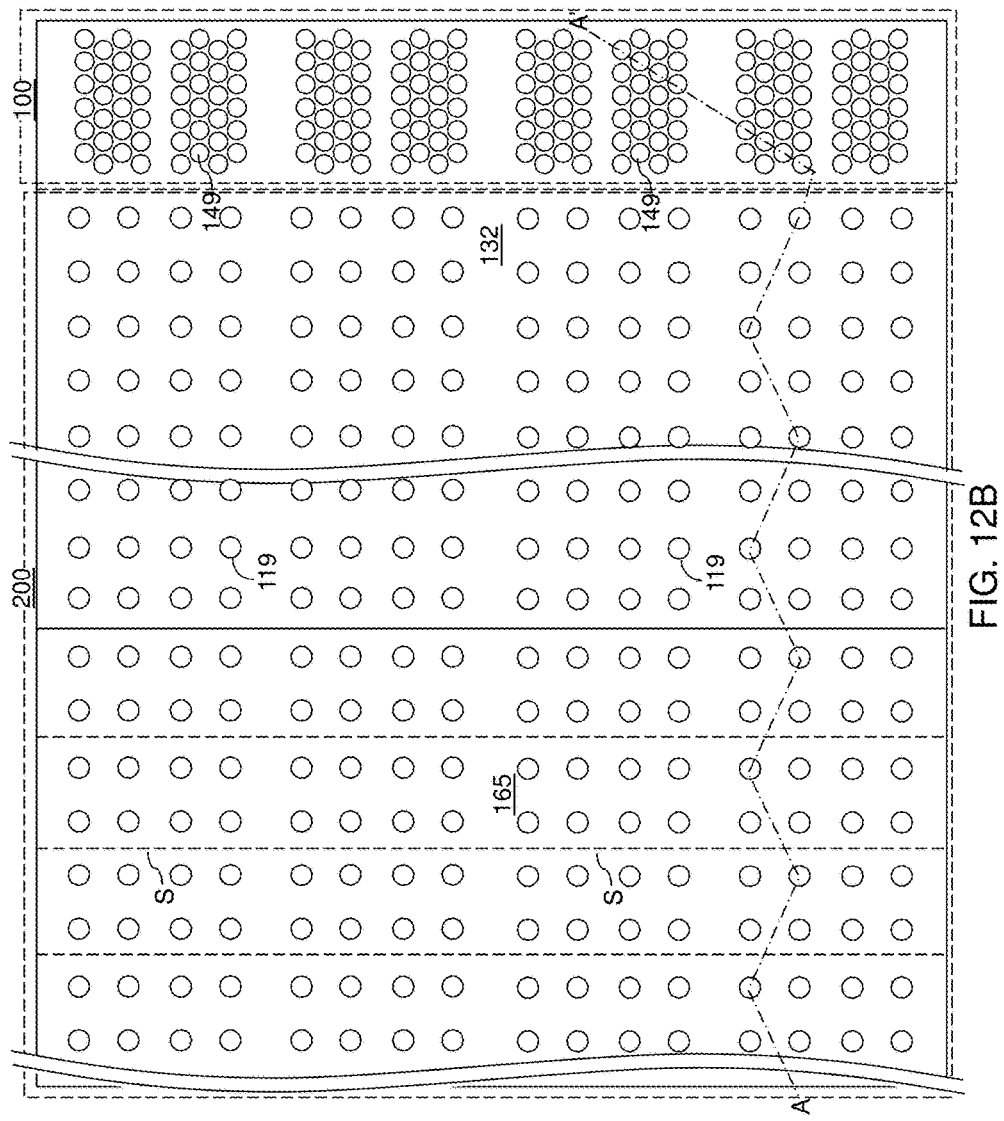

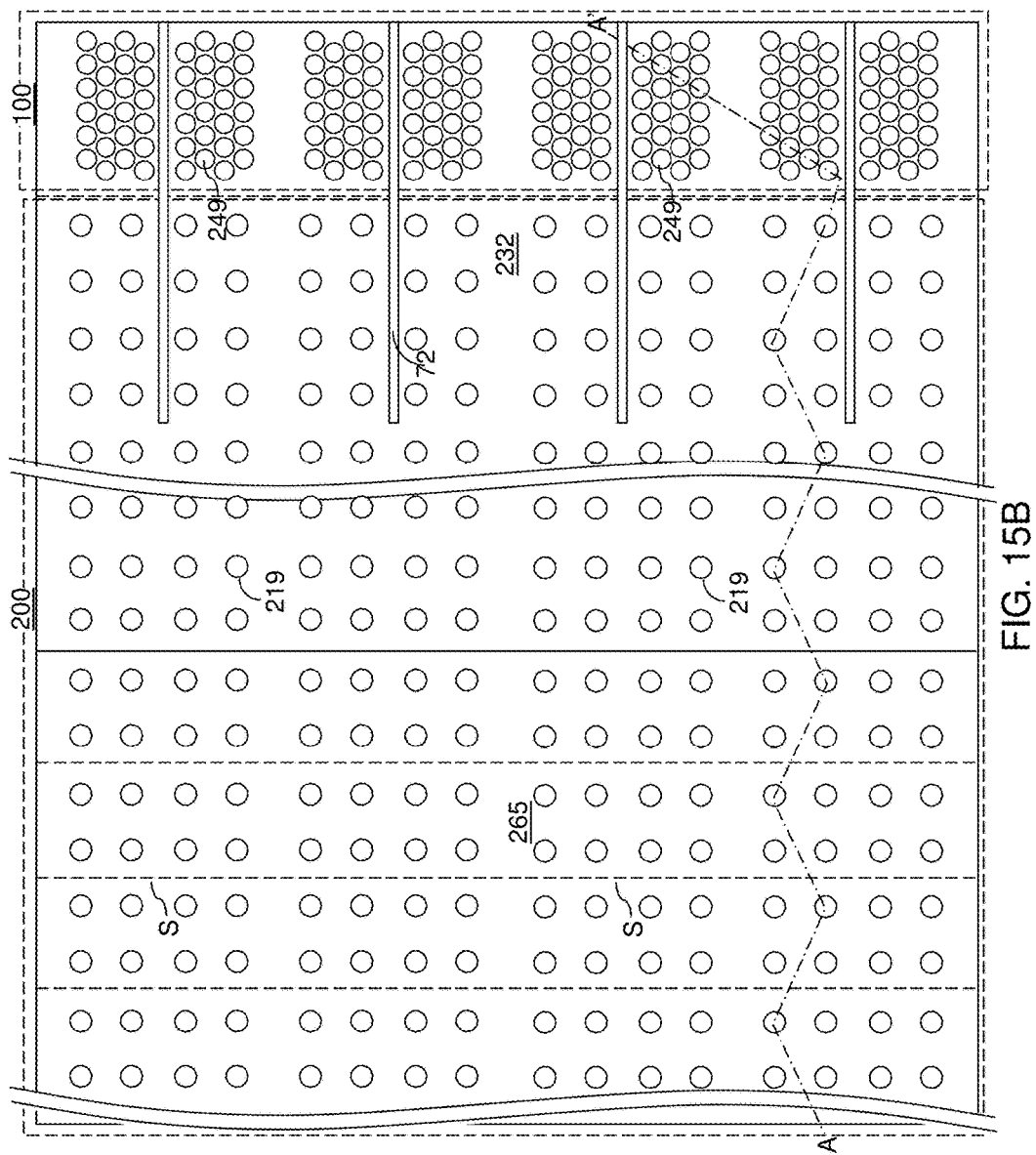

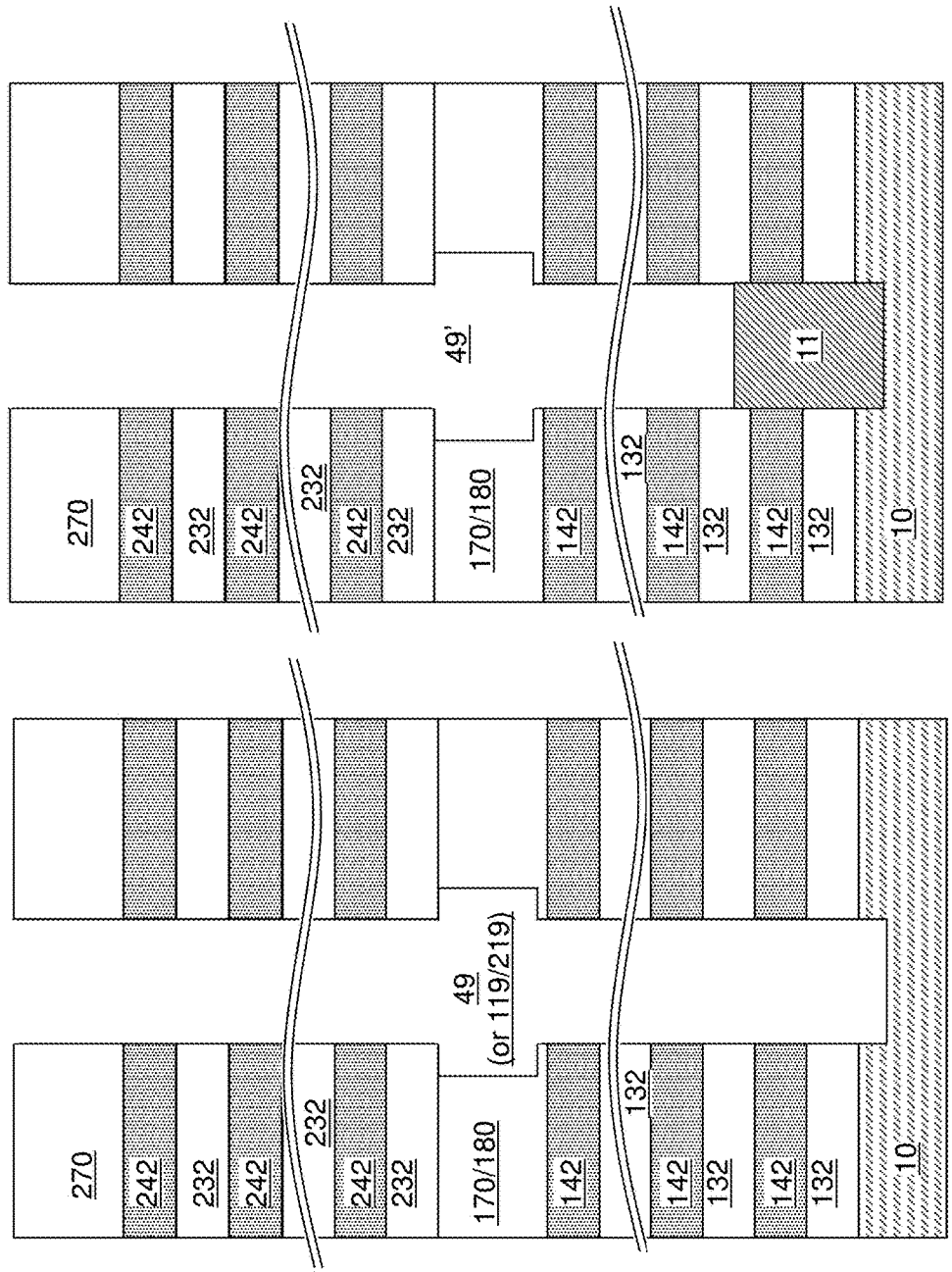

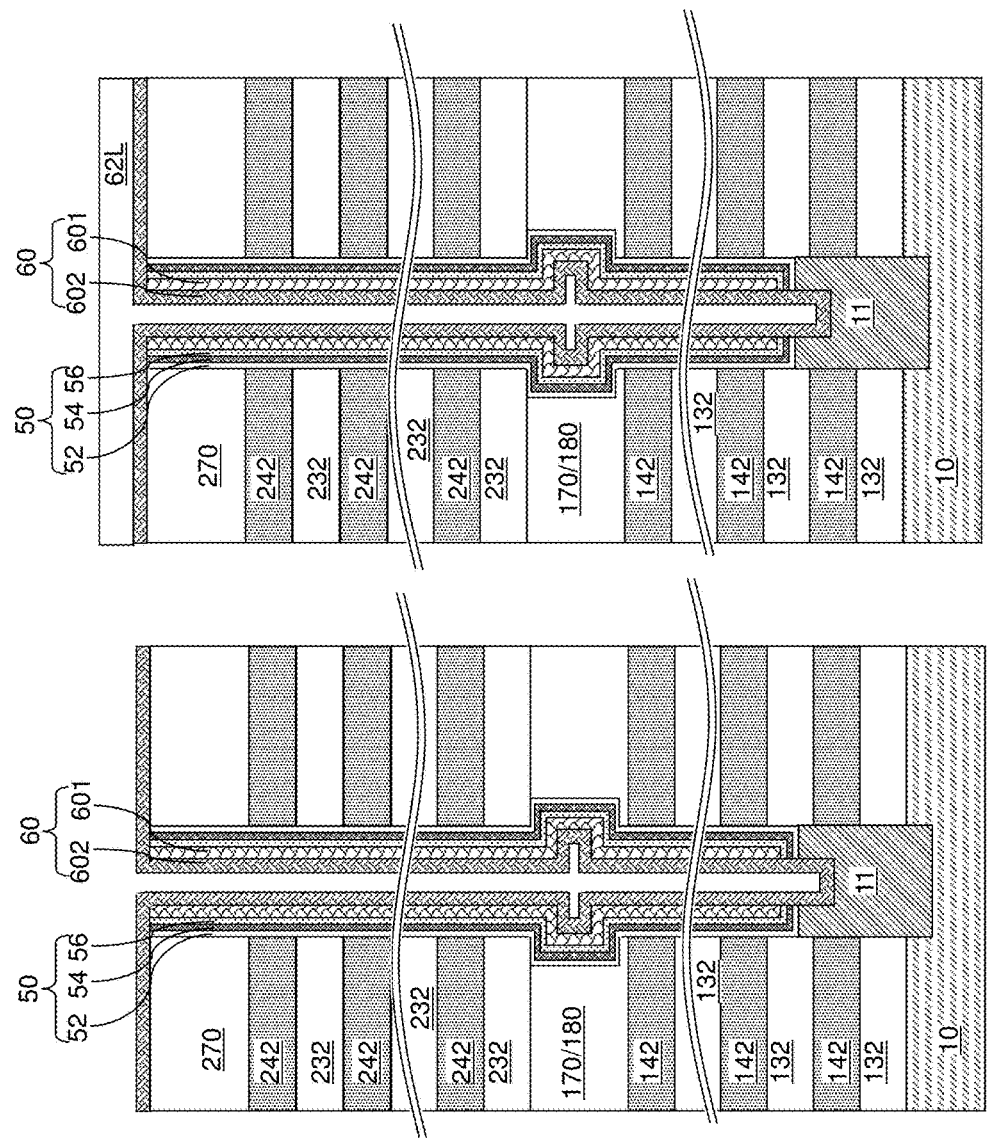

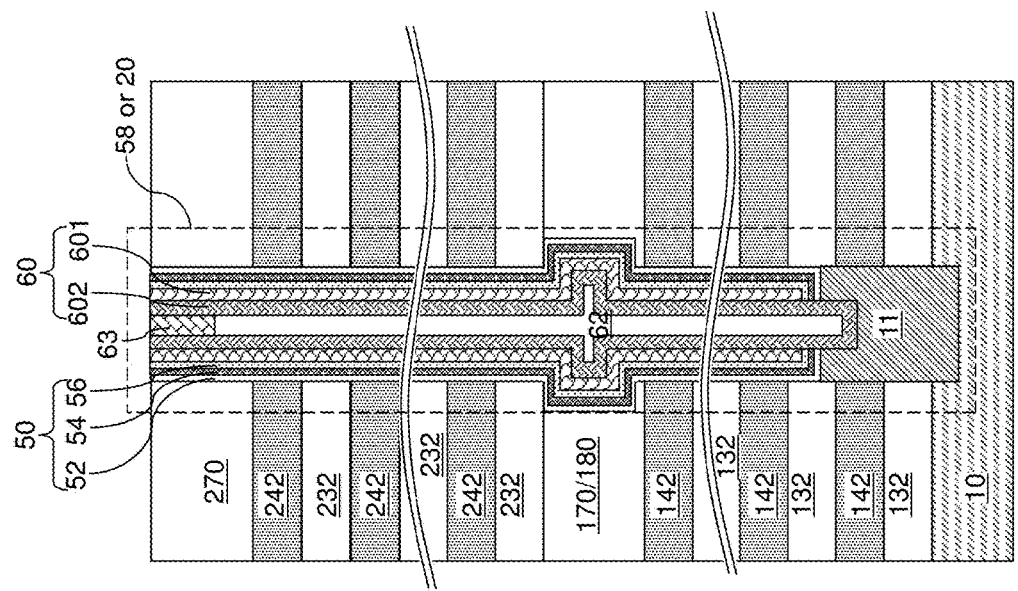
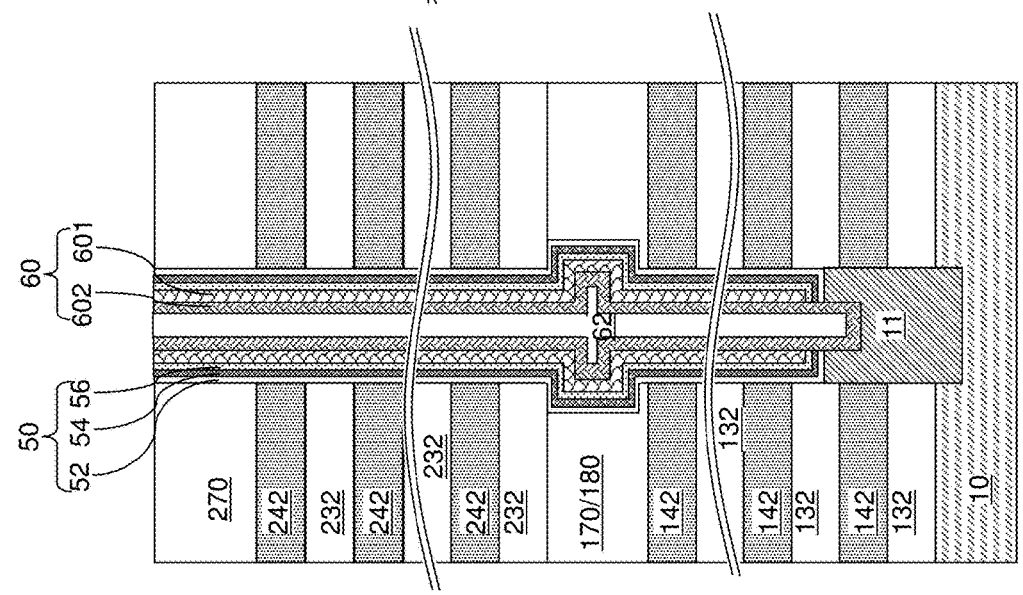

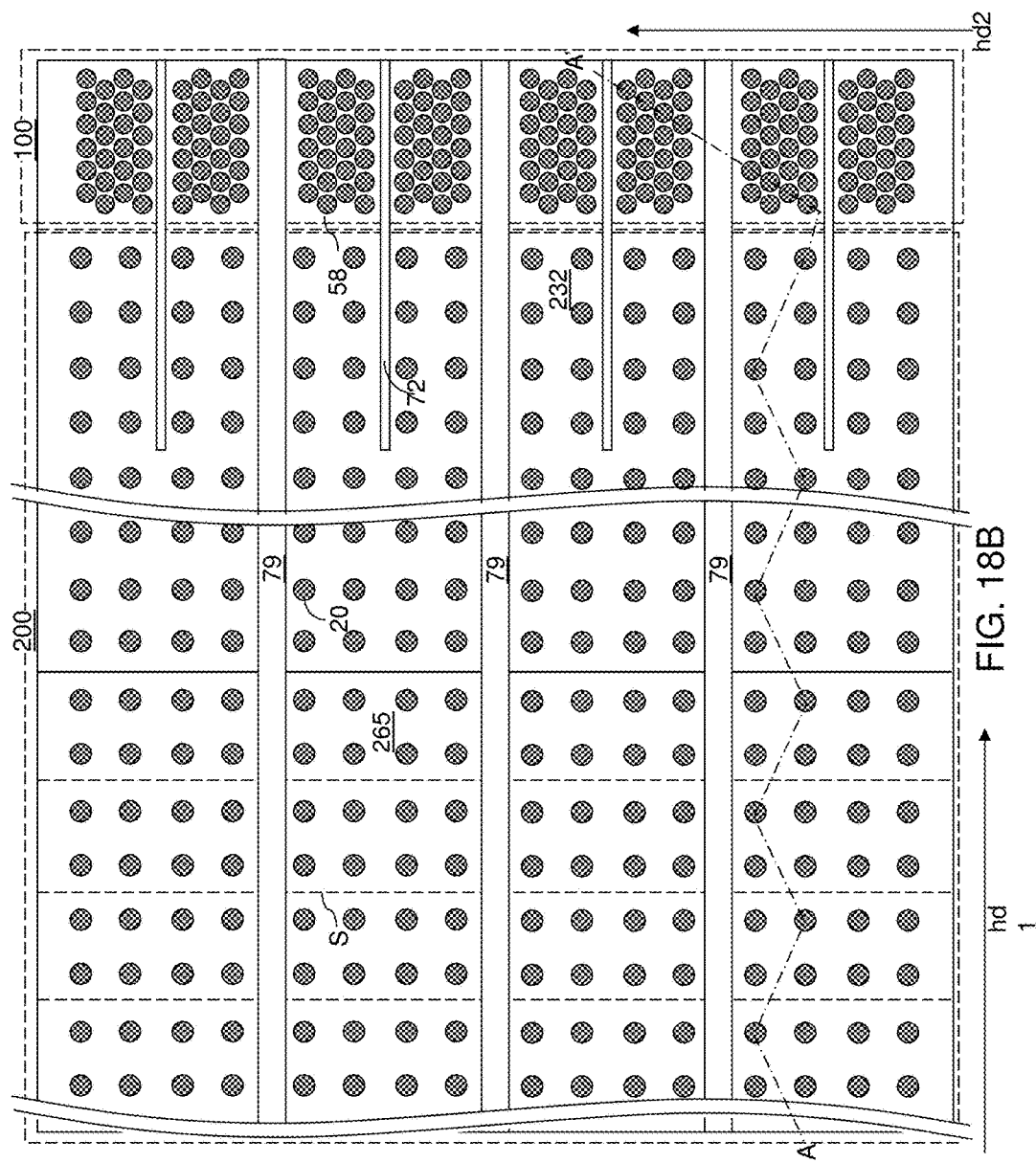

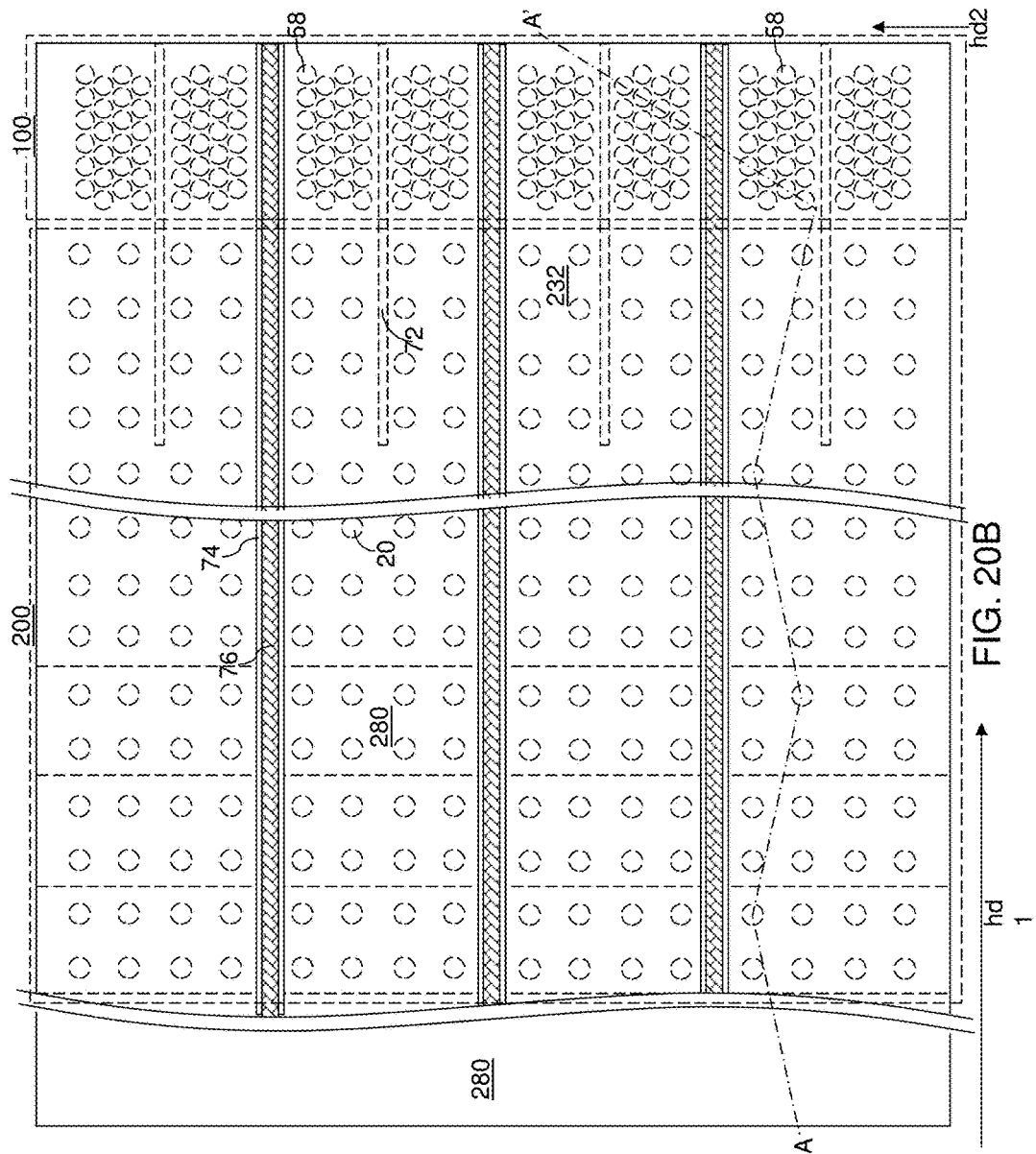

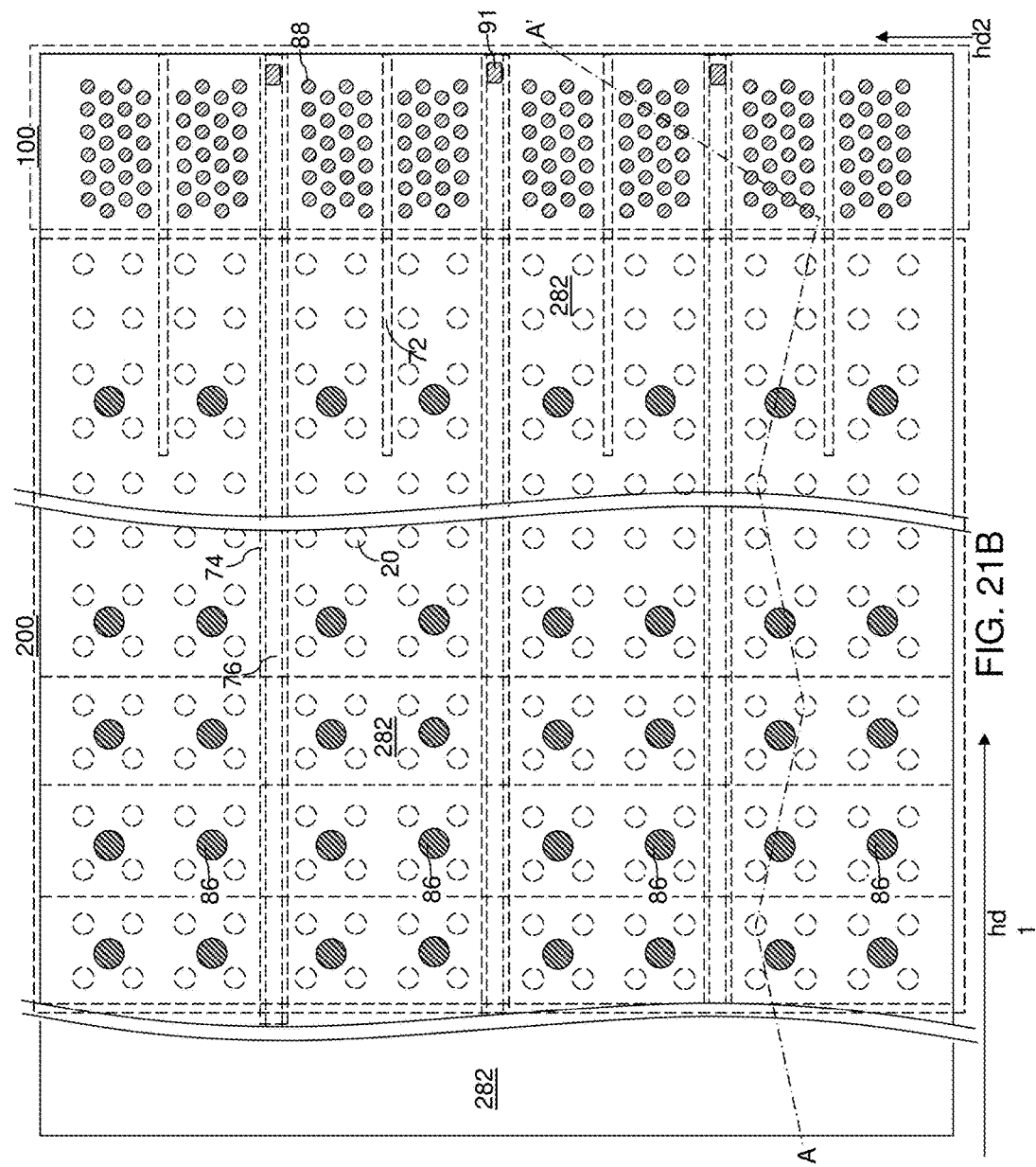

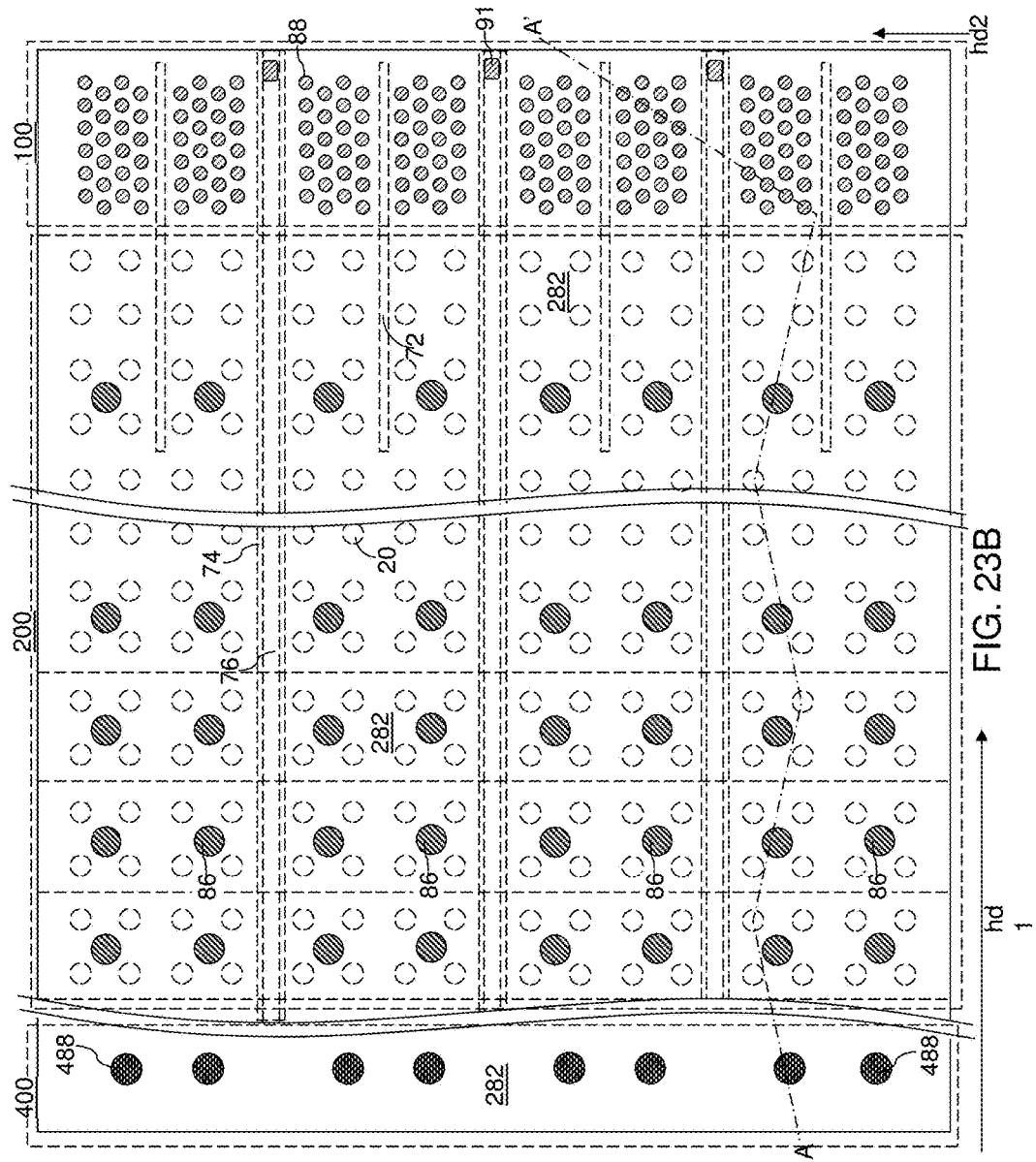

US 10,354,956 B1

THREE-DIMENSIONAL MEMORY DEVICE CONTAINING HYDROGEN DIFFUSION BARRIER STRUCTURES FOR CMOS UNDER ARRAY ARCHITECTURE AND METHOD OF MAKING THE SAME

FIELD

The present disclosure relates generally to the field of semiconductor devices and specifically to a three-dimensional memory device employing CMOS under array architecture with hydrogen diffusion barrier structures and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a semiconductor structure comprises a semiconductor device located on a semiconductor substrate, a silicon nitride layer overlying the semiconductor device, a contact via structure extending through the silicon nitride layer, the contact via structure comprising a lower contact via structure portion and an upper contact via structure portion, wherein a top surface of the lower contact via structure portion is located in a horizontal plane located between two horizontal planes containing respective top and bottom surfaces of the silicon nitride layer, a three-dimensional memory array overlying the silicon nitride layer, the three-dimensional memory array comprising an alternating stack of insulating layers and electrically conductive layers, and memory stack structures vertically extending through the alternating stack in a memory array region, and at least one metal interconnect structure overlying the contact via structure and providing electrical connection between the contact via structure and a node of the three-dimensional memory array.

According to another aspect of the present disclosure, a method of forming a semiconductor structure is provided, which comprises: forming a semiconductor device on a semiconductor substrate; forming a contact level silicon oxide layer over the semiconductor device; forming a silicon nitride layer over the contact level silicon oxide layer; forming a contact via cavity extending through the silicon nitride layer and the contact level silicon oxide layer, wherein a top surface of the semiconductor device is physically exposed at a bottom of the contact via cavity; forming a lower contact via structure portion in the contact via cavity by depositing at least one conductive material in the contact via cavity and recessing the at least one conductive material below a top surface of the silicon nitride layer and above a bottom surface of the silicon nitride layer; forming an upper contact via structure portion in a remaining volume of the contact via cavity, wherein a combination of the lower contact via structure portion and the upper contact via structure portion constitutes a contact via structure; forming a three-dimensional memory array over the silicon nitride layer, wherein the three-dimensional memory array comprises an alternating stack of insulating layers and electrically conductive layers and memory stack structures vertically extending through the alternating stack in a memory array region; and forming at least one metal interconnect structure over the contact via structure, wherein the at least one metal interconnect structure provides electrical connection between the contact via structure and a node of the three-dimensional memory array.

BRIEF DESCRIPTION OF THE DRAWINGS

FIG. 9 is a vertical cross-sectional view of the exemplary structure after formation of additional lower level dielectric material layers, additional lower level metal interconnect structures, an optional planar conductive material layer, and a planar semiconductor material layer according to an embodiment of the present disclosure.

FIG. 12B is a horizontal cross-sectional view of the exemplary structure along the horizontal plane B-B' in FIG. 12A. The zig-zag vertical plane A-A' corresponds to the plane of the vertical cross-sectional view of FIG. 12A.

FIG. 15B is a horizontal cross-sectional view of the exemplary structure along the horizontal plane B-B' in FIG. 15A. The zig-zag vertical plane A-A' corresponds to the plane of the vertical cross-sectional view of FIG. 15A.

FIGS. 17A-17H are sequential vertical cross-sectional views of an inter-tier memory opening during formation of a pillar channel portion, a memory stack structure, a dielectric core, and a drain region according to an embodiment of the present disclosure.

FIG. 18B is a horizontal cross-sectional view of the exemplary structure along the horizontal plane B-B' in FIG. 10A. The zig-zag vertical plane A-A' corresponds to the plane of the vertical cross-sectional view of FIG. 18A.

FIG. 20B is a horizontal cross-sectional view of the exemplary structure along the horizontal plane B-B' in FIG. 20A. The zig-zag vertical plane A-A' corresponds to the plane of the vertical cross-sectional view of FIG. 20A.

FIG. 21B is a horizontal cross-sectional view of the exemplary structure along the horizontal plane B-B' in FIG. 21A. The zig-zag vertical plane A-A' corresponds to the plane of the vertical cross-sectional view of FIG. 21A.

FIG. 23B is a horizontal cross-sectional view of the exemplary structure along the horizontal plane B-B' in FIG. 23A. The zig-zag vertical plane A-A' corresponds to the plane of the vertical cross-sectional view of FIG. 23A.

DETAILED DESCRIPTION

Figure 1:
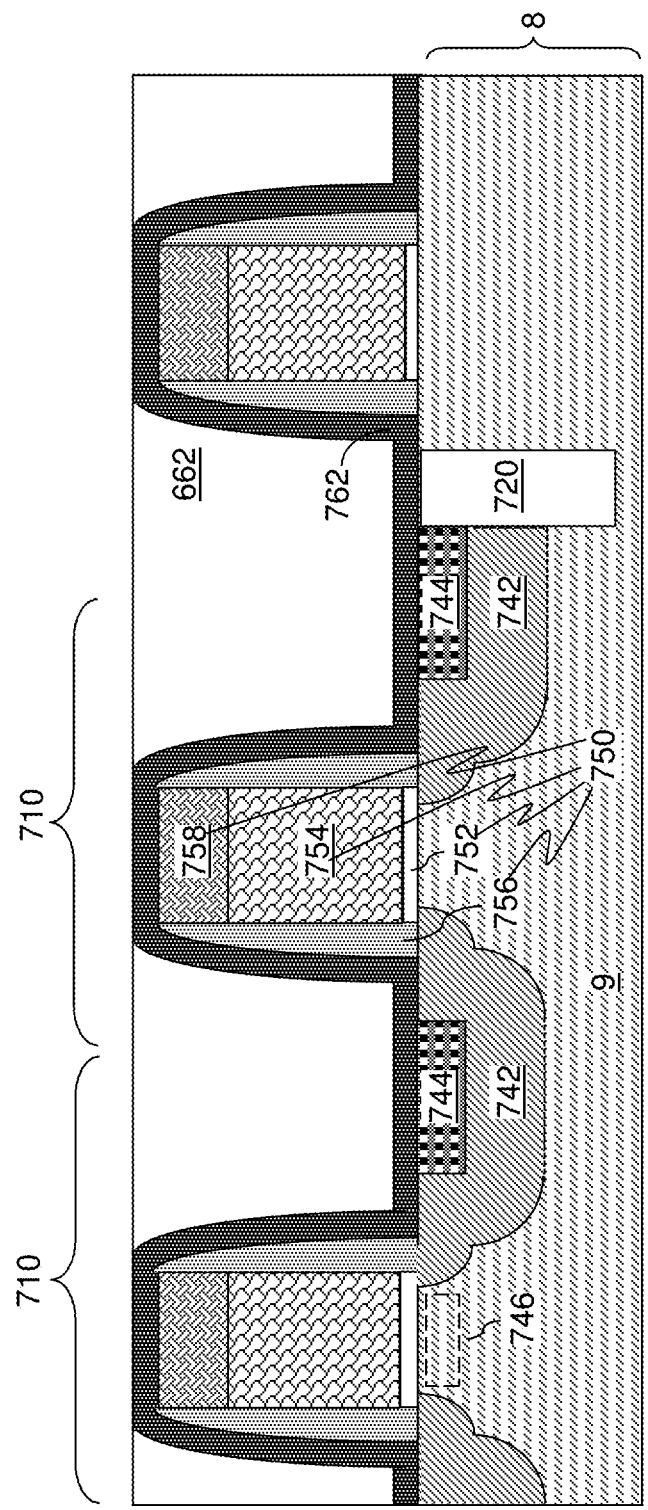
FIG. 1 is a vertical cross-sectional view of an exemplary structure after formation of semiconductor devices, a substrate capping silicon nitride layer, and a planarization dielectric layer over a semiconductor substrate according to an embodiment of the present disclosure.

As discussed above, the present disclosure is directed to a three-dimensional memory device employing CMOS under array architecture with hydrogen diffusion barrier structures and methods of making the same, the various aspects of which are described herein in detail. As three-dimensional memory devices scale to smaller device dimensions, the device area for peripheral devices can take up a significant portion of the total chip area. CMOS under array architecture has been proposed to stack a three-dimensional array of memory devices over underlying peripheral devices on a substrate. Hydrogen originating from various components of the three-dimensional array (such an alternating stack of hydrogen containing silicon oxide and silicon nitride layers) can diffuse to the CMOS transistors during the high temperature annealing of the device and deleteriously affect the device performance (e.g., increase in leakage current during the off-state) of the peripheral devices underlying the three-dimensional array of memory devices. Thus, embodiments of the present disclosure provide a structure and a method for blocking diffusion of hydrogen between the three-dimensional array of memory devices and the peripheral devices without disrupting the electrical continuity of the interconnect structures. The embodiments of the present disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Referring to FIG. 1, an exemplary structure according to an embodiment of the present disclosure is illustrated. The exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices.

The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and an optional gate metal silicide portion 758. In one embodiment, at least one of the field effect transistors can include at least one metal silicide portion, which may be an active region metal silicide portion 744 and/or a gate metal silicide portion 758. Each active region metal silicide portion 744 can be formed on a transistor active region 742 by reacting a metal with a semiconductor material of the transistor active region 742 to form a metal silicide. Each gate metal silicide portion 758 can be formed on a gate electrode 754 by reacting a metal with a semiconductor material within an upper portion of the gate electrode 754 to form a metal silicide. The metal silicide portions (744, 758) can include any metal silicide. Exemplary metal silicides include nickel silicide, cobalt silicide, titanium silicide, tantalum silicide, or tungsten silicide.

The semiconductor devices 710 can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

A silicon nitride layer can be formed to cap the semiconductor substrate 8 and the semiconductor devices 710 (e.g., the gate structures 750 of the semiconductor devices 710), which is herein referred to a substrate capping silicon nitride layer 762. Optionally, a silicon oxide liner (not illustrated) can be formed directly on the top surface of the semiconductor substrate 8 and the gate structures 750 prior to formation of the substrate capping silicon nitride layer 762. In one embodiment, the substrate capping silicon nitride layer 762 may apply a tensile stress or a compressive stress to underlying semiconductor devices to enhance performance of the underlying semiconductor devices. In one embodiment, two separate silicon nitride layers covering different regions of the semiconductor substrate 8 may be employed as the substrate capping silicon nitride layer 762. In this case, a first silicon nitride layer of the substrate capping silicon nitride layer 762 can cover first semiconductor devices in a first device region, and may apply a tensile stress to the first semiconductor devices (which may include n-type field effect transistors), and a second silicon nitride layer of the substrate capping silicon nitride layer 762 can over second semiconductor devices in a second device region, and may apply a compressive stress to the second semiconductor devices (which may include p-type field effect transistors). In one embodiment, the first silicon nitride layer and the second silicon nitride layer can complementarily cover the entire area of the semiconductor substrate 8, and collectively form the substrate capping silicon nitride layer 762. The thickness of the substrate capping silicon nitride layer 762 can be in a range from 10 nm to 100 nm, such as from 20 nm to 60 nm, although lesser and greater thicknesses can also be employed. The substrate capping silicon nitride layer 762 can function as a hydrogen diffusion barrier after formation of overlying dielectric material layers and devices.

A planarizable dielectric material can be deposited over the substrate capping silicon nitride layer 762 to form a planarization dielectric layer 662. The planarizable dielectric material can include undoped silicate glass (e.g., low hydrogen content silicon oxide), and can be deposited by plasma enhanced chemical vapor deposition. A densification anneal may be performed to reduce hydrogen content in the deposited undoped silicate glass. The planarization dielectric layer 662 can be subsequently planarized employing top surfaces of portions of the substrate capping silicon nitride layer 762 that overlie the gate structures 750. The planarization of the planarizable dielectric material can be performed, for example, by chemical mechanical planarization. Top surfaces of the portions of the substrate capping silicon nitride layer 762 that overlie the gate structures 750 can be employed as stopping surfaces during the planarization process. The planarization dielectric layer 662 overlies the transistor active regions 742 in the semiconductor substrate 8, and laterally surrounds the gate structures 750. The planarized top surface of the planarization dielectric layer 662 can be within a same horizontal plane as the topmost surfaces of the substrate capping silicon nitride layer 762 that overlie the gate structures 750.

Figure 2:
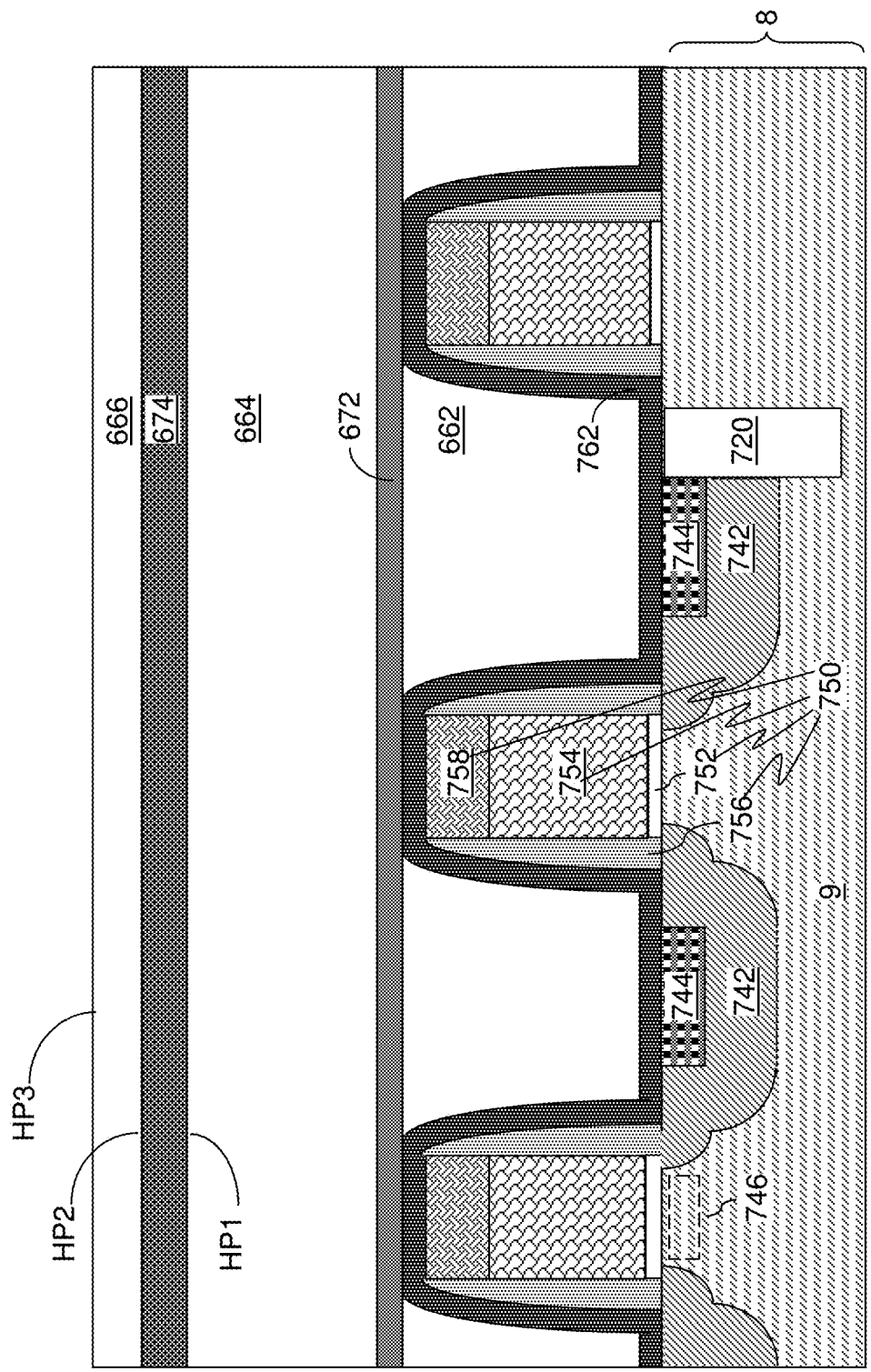
FIG. 2 is a vertical cross-sectional view of the exemplary structure after formation of a planar silicon nitride spacer layer, a contact level silicon oxide layer, a silicon nitride layer, and a dielectric cap layer according to an embodiment of the present disclosure.

Referring to FIG. 2, a planar silicon nitride spacer layer 672, a contact level silicon oxide layer 664, a silicon nitride layer 674, and an optional dielectric cap layer 666 can be sequentially deposited over the planarization dielectric layer 672.

The planar silicon nitride spacer layer 672 can be deposited by chemical vapor deposition such as low pressure chemical vapor deposition (LPCVD), and can have a thickness in a range from 6 nm to 60 nm, such as from 12 nm to 30 nm, although lesser and greater thicknesses can also be employed. The planar silicon nitride spacer layer 672 can be a planar layer having a planar bottom surface and a planar top surface. The planar silicon nitride spacer layer 672 can function as an etch stop structure during a subsequent etch process that forms via cavities through the contact level silicon oxide layer 664.

The contact level silicon oxide layer 664 includes undoped silicate glass, and can be formed by plasma enhanced chemical vapor deposition. The thickness of the contact level silicon oxide layer 664 can be in a range from 100 nm to 1,000 nm, such as from 200 nm to 600 nm, although lesser and greater thicknesses can also be employed. A densification anneal can be optionally performed after deposition of the undoped silicate glass to reduce the hydrogen content in the undoped silicate glass of the contact level silicon oxide layer 664. In one embodiment, the contact level silicon oxide layer 664 has a planar top surface within a first horizontal plane HP1.

The silicon nitride layer 674 is a diffusion barrier layer that forms a continuous diffusion barrier structure in combination with diffusion blocking conductive material portions to be subsequently formed therethrough. The silicon nitride layer 674 can be formed by low pressure chemical vapor deposition (LPCVD) process employing dichlorosilane (DCS) and ammonia as reactant gases at a temperature in a range from 600 degrees Celsius and 900 degrees Celsius and at a pressure in a range from 100 mTorr to 500 mTorr. However, other materials, pressures and temperatures may be used. For example, the silicon nitride may be deposited from other reactant gases or by a method other than LPCVD, or another dielectric material may be used instead of or in addition to silicon nitride. The silicon nitride layer 674 can be stoichiometric, i.e., have an atomic ratio of 3:4 between silicon atoms and nitrogen atoms. The thickness of the silicon nitride layer 674 can be in a range from 20 nm to 200 nm, such as from 40 nm to 100 nm, although lesser and greater thicknesses can also be employed. In one embodiment, the thickness of the silicon nitride layer 674 can be greater than 30 nm to provide effective hydrogen blocking property. In one embodiment, the silicon nitride layer 674 has a planar top surface within a second horizontal plane HP2.

The optional dielectric cap layer 666, if present, includes a dielectric material that can be employed as a stopping layer during a subsequent planarization process. For example, the optional dielectric cap layer 666 can include silicon oxide, silicon oxynitride, or a dielectric metal oxide (such as an aluminum nitride layer). The thickness of the optional dielectric cap layer 666 can be in a range from 3 nm to 100 nm, such as from 6 nm to 50 nm, although lesser and greater thicknesses can also be employed. The optional dielectric cap layer 666 can be deposited by chemical vapor deposition or atomic layer deposition. If the dielectric cap layer 666 is present, the dielectric cap layer 666 has a planar top surface within a third horizontal plane HP3.

Figure 3:
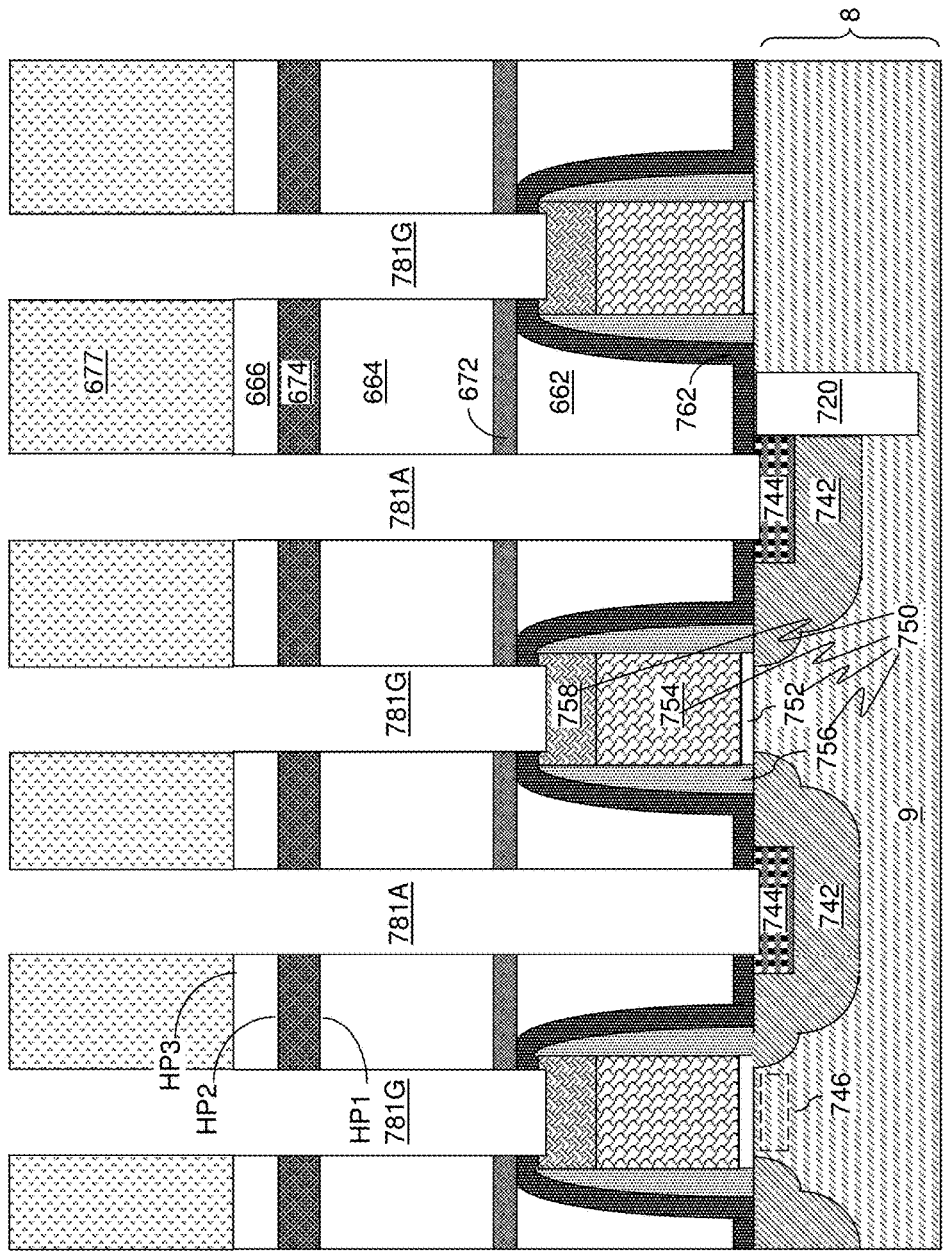
FIG. 3 is a vertical cross-sectional view of the exemplary structure after formation of contact via cavities according to an embodiment of the present disclosure.

Referring to FIG. 3, a photoresist layer 677 can be applied over the silicon nitride layer 674 (and over the dielectric cap layer 666, if present), and can be lithographically patterned to form openings in areas in which contact via structures are to be subsequently formed. In one embodiment, the areas of the opening in the photoresist layer 677 can overlie the areas of the metal silicide portions (744, 758). In one embodiment, the areas of the openings in the photoresist layer 677 can be entirely within the areas enclosed by peripheries of the metal silicide portions (744, 758).

An anisotropic etch process can be performed to transfer the pattern of the openings through the underlying layers. In areas of openings in the photoresist layer 677 that overlie the active region metal silicide portions 744, active region contact via cavities 781A are formed through the optional dielectric cap layer 666, the silicon nitride layer 674, the contact level silicon oxide layer 664, the planar silicon nitride spacer layer 672, the planarization dielectric layer 662, and the substrate capping silicon nitride layer 762 (and any underlying silicon oxide liner, if present). A top surface (which may, or may not, be recessed due to the anisotropic etch) of an active region metal silicide portion 744 is physically exposed at the bottom of each active region contact via cavity 781A. In areas of openings in the photoresist layer 677 that overlie the gate metal silicide portions 758, gate contact via cavities 781G are formed through the optional dielectric cap layer 666, the silicon nitride layer 674, the contact level silicon oxide layer 664, the planar silicon nitride spacer layer 672, and the substrate capping silicon nitride layer 762 (and any underlying silicon oxide liner, if present).

The anisotropic etch process can include a series of etch steps including a respective etch chemistry so that the series of etch steps sequentially etches the various layers between the photoresist layer 677 and the metal silicide portions (744, 758). In one embodiment, the series of etch steps can include an etch step for etching the optional dielectric cap layer 666, an etch step for etching the silicon nitride layer 674, an etch step for etching the contact level silicon oxide layer 664, an etch step for etching the planar silicon nitride spacer layer 672, an etch step that etches the silicon oxide material of the planarization dielectric layer 662 selective to silicon nitride to prevent overetching into the substrate capping silicon nitride layer 762, and an etch step for etching the substrate capping silicon nitride layer 762 (and an etch step for etching any underlying silicon oxide liner, if present). In one embodiment, the metal silicide portions (744, 758) can function as etch stop structures for the anisotropic etch process.

Generally, a top surface of the semiconductor devices 710 can be physically exposed at the bottom of each contact via cavity (781A, 781G), which may be an active region contact via cavity 781A or a gate contact via cavity 781G. Each contact via cavity (781A, 781G) can have a vertical profile or a tapered profile with a straight sidewall that extends between the third horizontal plane HP3 (or the second horizontal plane HP2 in case the optional dielectric cap layer 666 is not present) and a surface of the semiconductor devices 710. The photoresist layer 677 is subsequently removed, for example, by ashing.

While the present disclosure is described employing an embodiment in which metal silicide portions (744, 758) are provided at the bottom of the contact via cavities (781A, 781G), embodiments are expressly contemplated herein in which a metal silicide portion is not provided at the bottom a contact via trench, and a contact via structure is formed directly on a semiconductor material portion or a metal portion within the semiconductor substrate 8 or within the gate structures 750. For example, a metal gate electrode portion may replace a gate metal silicide portion 758 in one or more of the gate structures 750. In this case, a top surface of a metal gate electrode can be physically exposed at the bottom of each gate contact via cavity 781G.

Figure 4:
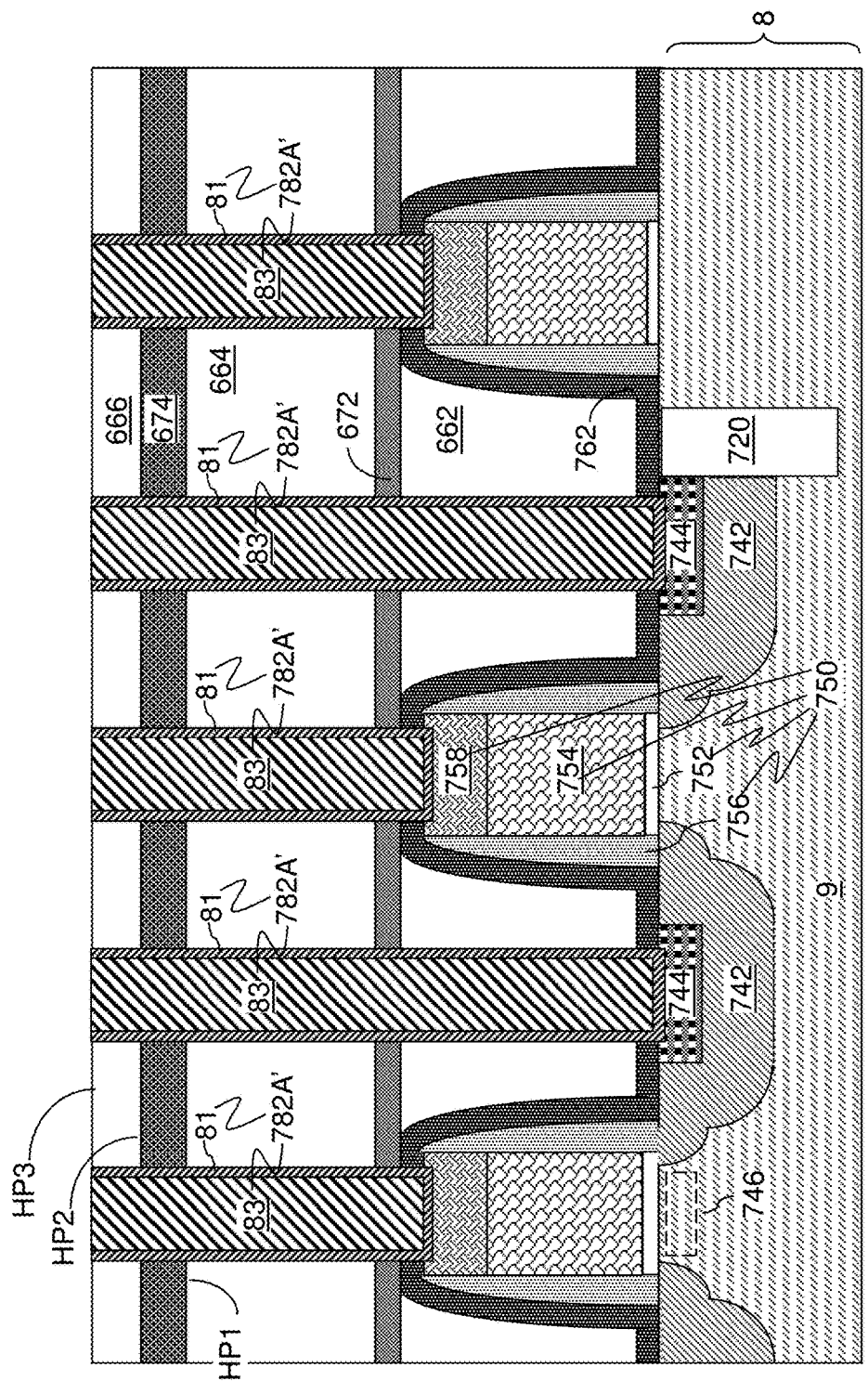
FIG. 4 is a vertical cross-sectional view of the exemplary structure after formation of antecedent lower contact via structure portions according to an embodiment of the present disclosure.

Referring to FIG. 4, an antecedent lower contact via structure portion 782A' is formed within each of the contact via cavities (781A, 781G) by depositing at least one conductive material in each of the contact via cavities (781A, 781G). As used herein, an "antecedent" element is an element that is subsequently modified to provide an element that is incorporated into a manufactured device. In other words, an antecedent element is subsequently modified to form another element. Thus, each antecedent lower contact via structure portion 782A' is subsequently modified (and specifically, vertically recessed) to provide a respective lower contact via structure portion.

For example, a metallic nitride liner 81 can be deposited in each of the contact via cavities (781A, 781G). The metallic nitride liner 81 can include a conductive metallic nitride material such as TiN, TaN, and/or WN, and can function as a diffusion barrier layer for elemental metal to be subsequently deposited. The metallic nitride liner 81 can contact the physically exposed surfaces of the semiconductor devices 710 such as the metal silicide portions (744, 758). The metallic nitride liner 81 can be formed as a continuous material layer by physical vapor deposition or chemical vapor deposition.

Subsequently, a metal such as tungsten, copper, or aluminum can be deposited in remaining volumes of the contact via cavities (781A, 781G) by physical vapor deposition, chemical vapor deposition, or electroplating. In one embodiment, the metal can consist essentially of at least one metallic element, which can be a single elemental metallic element or a plurality of metallic elements provided as a layer stack or as an alloy.

Portions of the deposited metal and the metallic nitride liner 81 located over the third horizontal plane HP3 (or the second horizontal plane HP2 in case the optional dielectric cap layer 666 is not present) can be removed by a planarization process such as a recess etch or chemical mechanical planarization. Each remaining portion of the deposited metal in a contact via cavity (781A, 781G) constitutes a metal fill portion 83. The metallic nitride liner 81 is divided into multiple portions, each of which is located entirely within a respective one of the contact via cavities (781A, 781G). Each combination of adjacent a metallic nitride liner 81 and a metal fill portion 83 constitutes an antecedent lower contact via structure portion 782A'. The antecedent lower contact via structure portions 782A' can have a top surface that is within the third horizontal plane HP3 (or the second horizontal plane HP2 in case the optional dielectric cap layer 666 is not present).

Figure 5:
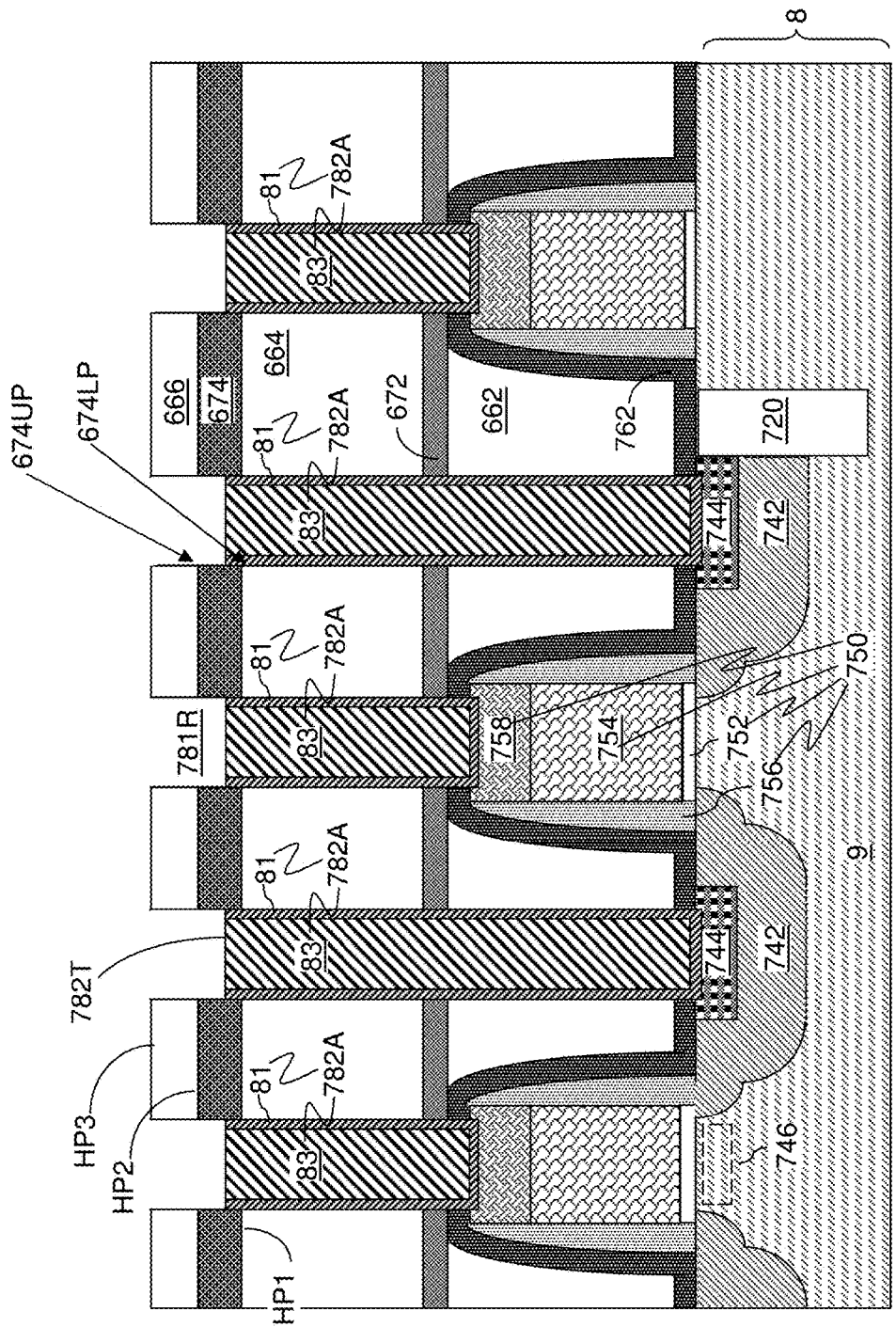
FIG. 5 is a vertical cross-sectional view of the exemplary structure after formation of lower contact via structure portions by recessing the antecedent lower contact via structures according to an embodiment of the present disclosure.

Referring to FIG. 5, the at least one conductive material of the antecedent lower contact via structure portions 782A' can be vertically recessed by an etch process, which can include an anisotropic etch (such as a reactive ion etch) or an isotropic etch (such as a wet etch). The duration of the etch process can be controlled so that the top surface 782T of each remaining portion of the antecedent lower contact via structure portions 782A' is located in a horizontal plane (i.e., plane parallel to top surface of semiconductor substrate 8) between the two horizontal planes containing the respective top and bottom surfaces of the silicon nitride layer 674. In other words, the top surface 782T of each remaining portion of the antecedent lower contact via structure portions 782A' is located in a horizontal plane between the first horizontal plane HP1 and the second horizontal plane HP2. Therefore, the duration of the etch process can be controlled so that the entire periphery of a top surface 782T of each remaining portion of the antecedent lower contact via structure portions 782A' is located on a sidewall surface of a respective opening through the silicon nitride layer 674 between an upper periphery 674UP of the sidewall surface and a lower periphery 674LP of the sidewall surface. Each remaining portion of the antecedent lower contact via structure portions 782A' is a lower contact via structure portion 782A. For each lower contact via structure portion 782A, the vertical distance between the second horizontal plane HP2 including the top surface of the silicon nitride layer 674 and the top surface 782T of the lower contact via structure portion 782A can be in a range from 10% to 90%, such as from 20% to 80%, of the thickness of the silicon nitride layer 674. Each lower contact via structure portion 782A is formed in a lower portion of a respective one of the contact via cavities (781A, 781G). A recess cavity 781R is present in an upper portion of each of the contact via cavities (781A, 781G).

Figure 6A:
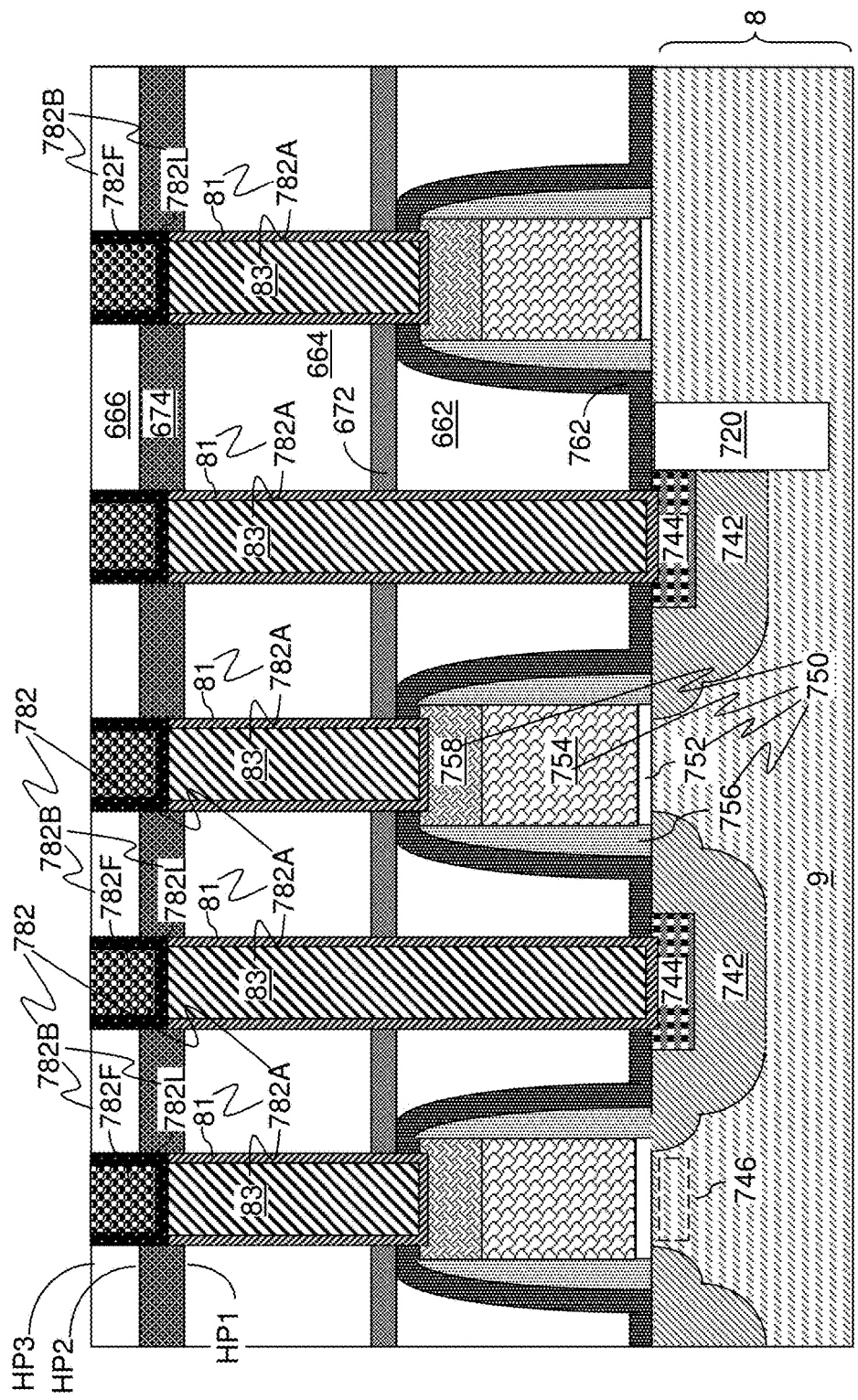
FIG. 6A is a vertical cross-sectional view of the exemplary structure after formation of upper contact via structure portions according to an embodiment of the present disclosure.

Referring to FIG. 6A, at least one metallic diffusion barrier material can be deposited in the recess cavities 781R overlying the lower contact via structure portions 782. The at least one metallic diffusion barrier material is a metallic material that blocks diffusion of hydrogen therethrough. The at least one metallic diffusion barrier material can include a metal silicide such tungsten silicide, titanium silicide, cobalt silicide, or nickel silicide, and/or a metallic element (such as titanium) that blocks diffusion of hydrogen therethrough. In one embodiment, the at least one metallic diffusion barrier material can be selected from at least one of a metal silicide, titanium nitride and elemental titanium.

In one embodiment, the at least one metallic diffusion barrier material can include a plurality of metallic diffusion barrier materials that are sequentially deposited. In one embodiment, a first layer of a first metallic diffusion barrier material and a second layer of a second metallic diffusion barrier material can be sequentially deposited in each of the recess cavities 781R and over the optional dielectric cap layer 666 (or the silicon nitride layer 674). For example, the first metallic diffusion barrier material can be a metal silicide and the second metallic diffusion barrier material can be titanium or a metal nitride (e.g., TiN, WN, TaN, etc.), or vice versa. Excess portions of the first and second metallic diffusion barrier materials can be removed from above the third horizontal plane HP3 (or from above the second horizontal plane HP2 if the optional dielectric cap layer 666 is not present) by a planarization process. The planarization process can employ a recess etch and/or chemical mechanical planarization.

Each remaining portion of the first metallic diffusion barrier material after the planarization process constitutes a diffusion barrier liner 782L, which consists essentially of the first metallic diffusion barrier material. The diffusion barrier liners 782L can be formed on a respective one of the lower contact via structure portions 782A. Each remaining portion of the second metallic barrier material after the planarization process constitutes a diffusion barrier material portion 782F, which consists essentially of the second metallic diffusion barrier material and is formed within one of the diffusion barrier liners 782L. Each combination of adjacent a diffusion barrier liner 782L and a diffusion barrier material portion 782F constitutes an upper contact via structure portion 782B. A top surface of each upper contact via structure portion 782B includes an annular top surface of the diffusion barrier layer 782L. Each diffusion barrier material portion 782F is embedded within a diffusion barrier liner 782L. Each metallic nitride liner 81 of the lower contact via structure portions 782A can have an annular top surface that contacts a bottom surface of one of the diffusion barrier liners 782L.

Each combination of adjacent a lower contact via structure portion 782A and an upper contact via structure portion 782B constitutes a contact via structure 782. Each of the contact via structures 782 is located within a contact via cavity having a straight sidewall extending at least from the second horizontal plane HP2 to a component of an underlying semiconductor device 710 (which may be a metal silicide portion (744, 758)). In one embodiment, a bottom surface of a contact via structure 782 can be formed on a metal silicide portion (744, 758). If the contact via structures 782 are formed through the dielectric cap layer 666, the top surface of each upper contact via structure portion 782B can be formed within the third horizontal plane HP3 including the top surface of the dielectric cap layer 666.

Figure 6B:
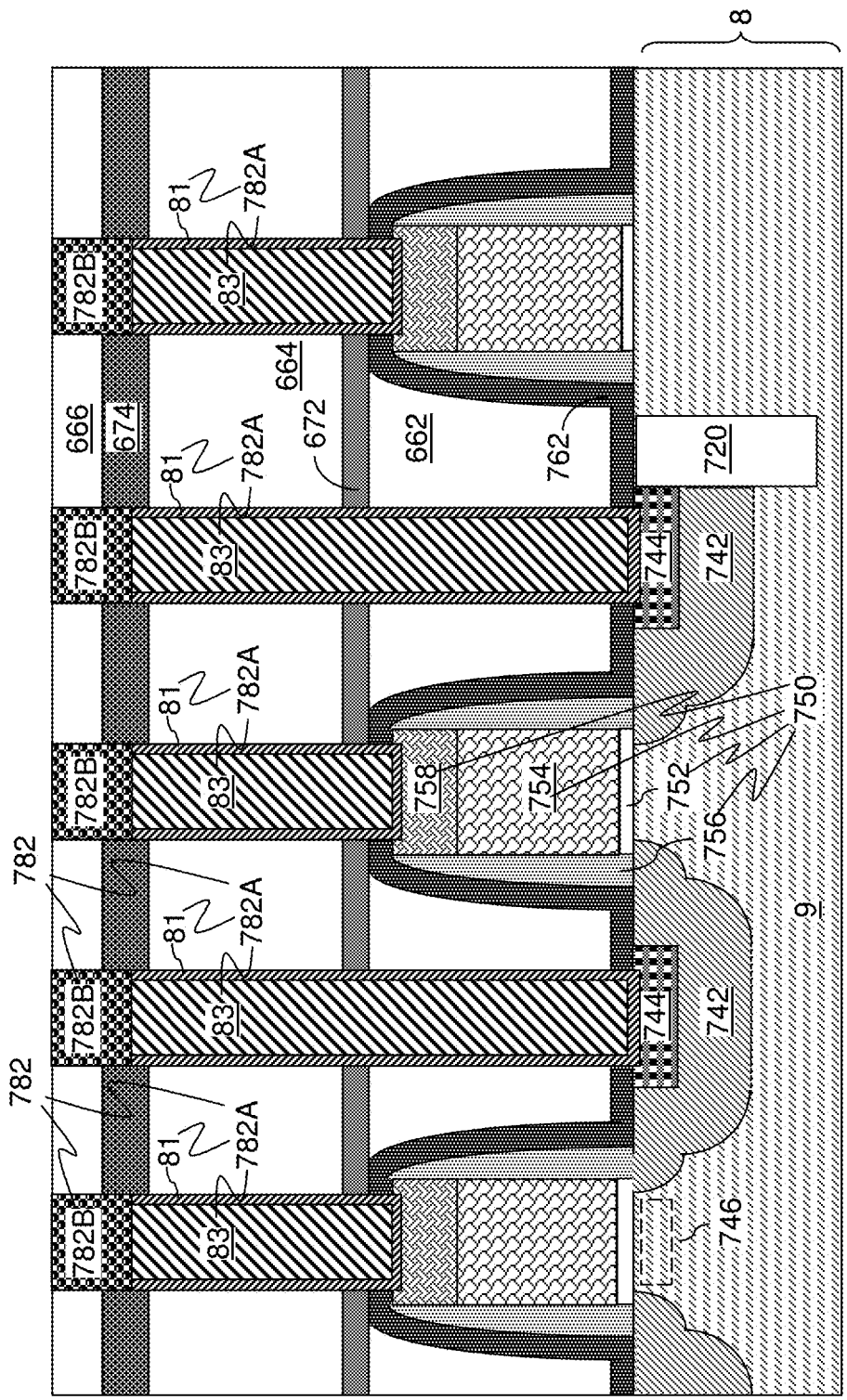
FIG. 6B is a first alternative embodiment of the exemplary structure of FIG. 6A.

Referring to FIG. 6B, a first alternative embodiment of the exemplary structure of FIG. 6A is illustrated, which can be derived from the exemplary structure of FIG. 6A by employing a single metallic diffusion barrier material in lieu of a plurality of metallic diffusion barrier materials to form the upper contact via structure portions 782B. In this case, each of the upper contact via structure portions 782B can consist essentially of a single metallic diffusion barrier material. In one embodiment, the single metallic diffusion barrier material can be selected from at least one of a metal silicide, titanium nitride and elemental titanium. In the first alternative embodiment of the exemplary structure, the single metallic diffusion barrier material can be deposited in the recess cavities formed at the processing steps of FIG. 5 by chemical vapor deposition, physical vapor deposition, or electroplating. Excess portions of the single metallic diffusion barrier material can be removed from above the third horizontal plane HP3 (of from above the second horizontal plane HP2 in case the dielectric cap layer 666 is not present) by a planarization process. Each remaining portion of the single metallic diffusion barrier material filling the recess cavities constitutes an upper contact via structure portion 782B.

Each combination of adjacent a lower contact via structure portion 782A and an upper contact via structure portion 782B constitutes a contact via structure 782. Each of the contact via structures 782 is located within a contact via cavity having a straight sidewall extending at least from the second horizontal plane HP2 to a component of an underlying semiconductor device (which may be a metal silicide portion (744, 758)).

Figure 7A:
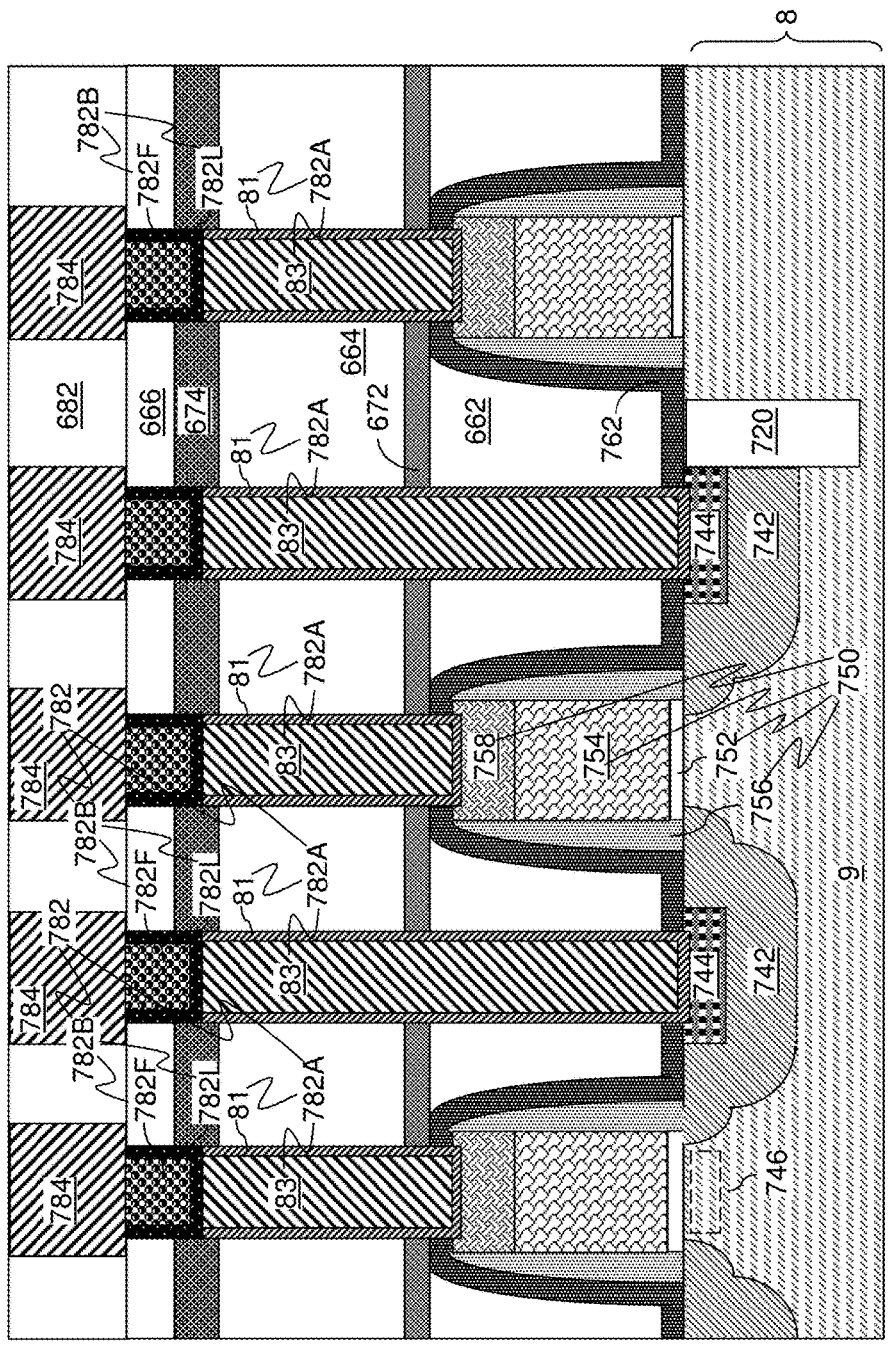
FIG. 7A is a vertical cross-sectional view of the exemplary structure after formation of a first line level lower dielectric material layer and first level lower line structures according to an embodiment of the present disclosure.

Referring to FIG. 7A, a first line level lower dielectric material layer 682 and first level lower line structures 784 can be formed over the contact via structures 782 of FIG. 6A. The first line level lower dielectric material layer 682 is a dielectric material layer that is formed at a level located below the levels of memory devices to be subsequently formed. The first level lower line structures 784 are line level metal interconnect structures that are most proximal to the semiconductor substrate 8 among all line level metal interconnect structures to be formed above the semiconductor substrate 8.

The first line level lower dielectric material layer 682 includes a dielectric material such as doped silicate glass, undoped silicate glass, or organosilicate glass. The first line level lower dielectric material layer 682 can include hydrogen therein because the combination of the silicon nitride layer 674 and the upper contact via structure portions 782B functions as a continuous hydrogen diffusion blocking structure. The first line level lower dielectric material layer 682 can be deposited by chemical vapor deposition. The first line level lower dielectric material layer 682 can have a thickness in a range from 100 nm to 1,000 nm, although lesser and greater thicknesses can also be employed.

The first level lower line structures 784 can be formed by forming trenches through the first line level lower dielectric material layer 682, and by filling the trenches with at least one conductive material. For example, a metal liner and a metal fill material can be deposited in the trenches, and excess portions of the metal liner and the metal fill material can be removed from above the top surface of the first line level lower dielectric material layer 682 by a planarization process such as chemical mechanical planarization. Each remaining portion of the metal liner and the metal fill material constitutes a first level lower line structure 784.

The first level lower line structures 784 can be formed on the top surfaces of the contact via structures 782. In one embodiment, each diffusion barrier layer 782L of the upper contact via structure portions 782B can have an annular top surface that contacts a bottom surface of a respective one of the first level lower line structures 784.

Figure 7B:
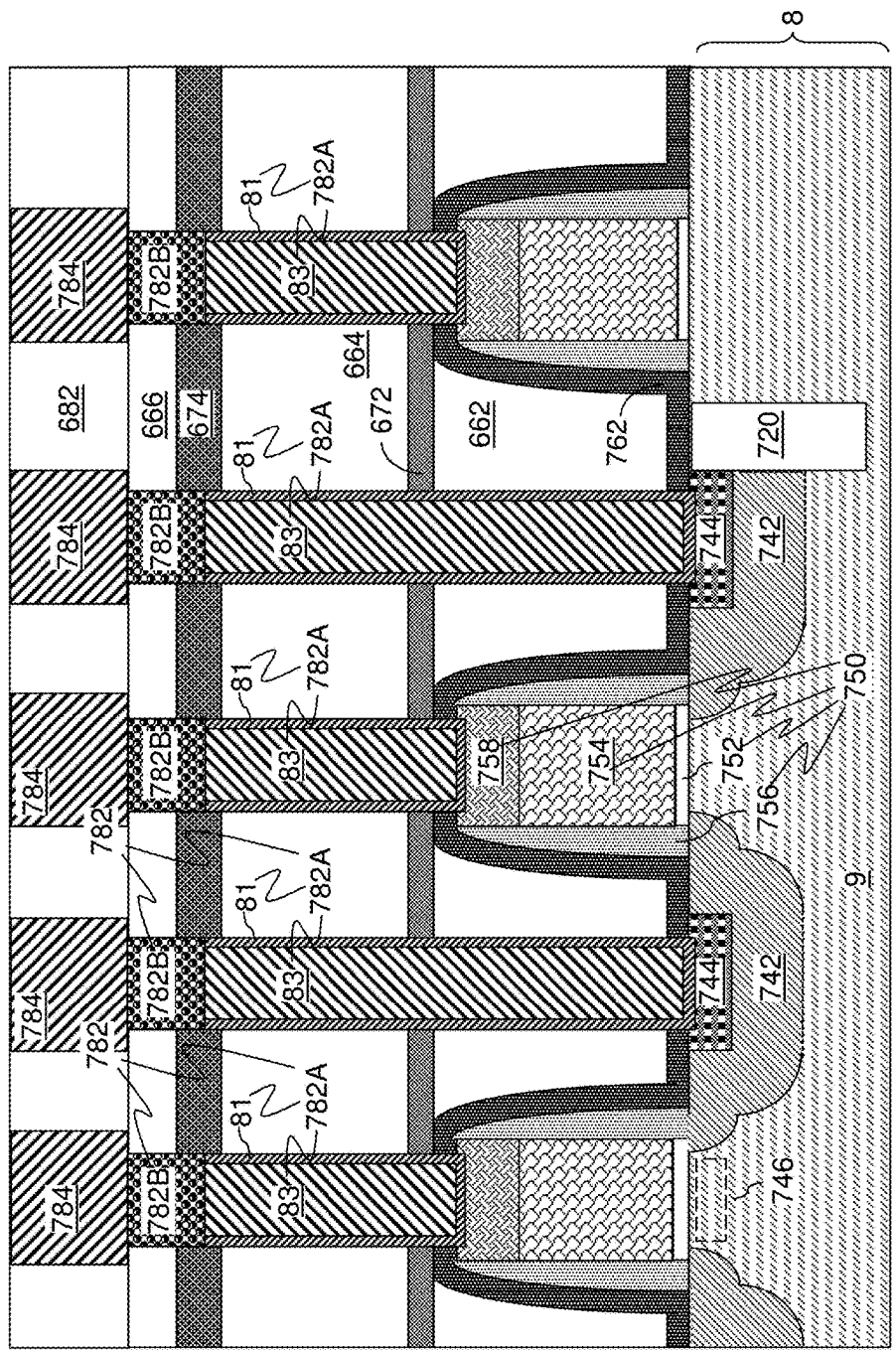
FIG. 7B is a first alternative embodiment of the exemplary structure of FIG. 7A.

Referring to FIG. 7B, a first alternate embodiment of the exemplary structure of FIG. 7A is illustrated, which can be derived from the first exemplary embodiment of the exemplary structure illustrated in FIG. 6B by performing the processing steps of FIG. 7A, i.e., by forming the first line level lower dielectric material layer 682 and the first level lower line structures 784 over the contact via structures 782 of FIG. 6B. The upper contact via structures 782B can have top surfaces that contact a respective one of the first level lower line structures 784.

Figure 8A:
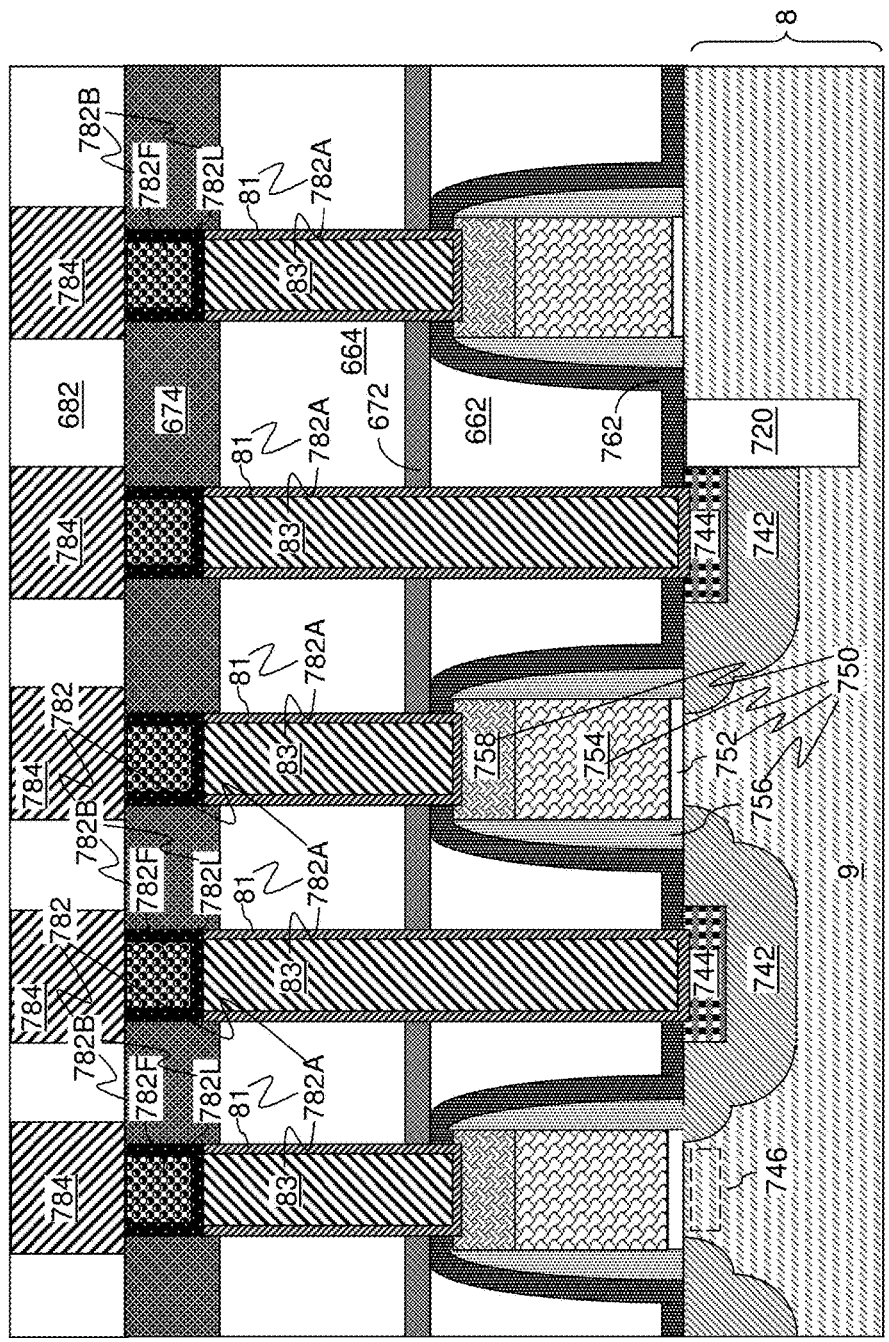
FIG. 8A is a second alternative embodiment of the exemplary structure of FIG. 7A.

Referring to FIG. 8A, a second alternative embodiment of the exemplary structure of FIG. 7A is illustrated, which can be derived from the exemplary structure of FIG. 7A by omitting the optional dielectric cap layer 666. In this case, the top surface of the silicon nitride layer 674 can be coplanar with the top surfaces of the contact via structures 782, and contact the bottom surface of the first line level lower dielectric material layer 682.

Figure 8B:
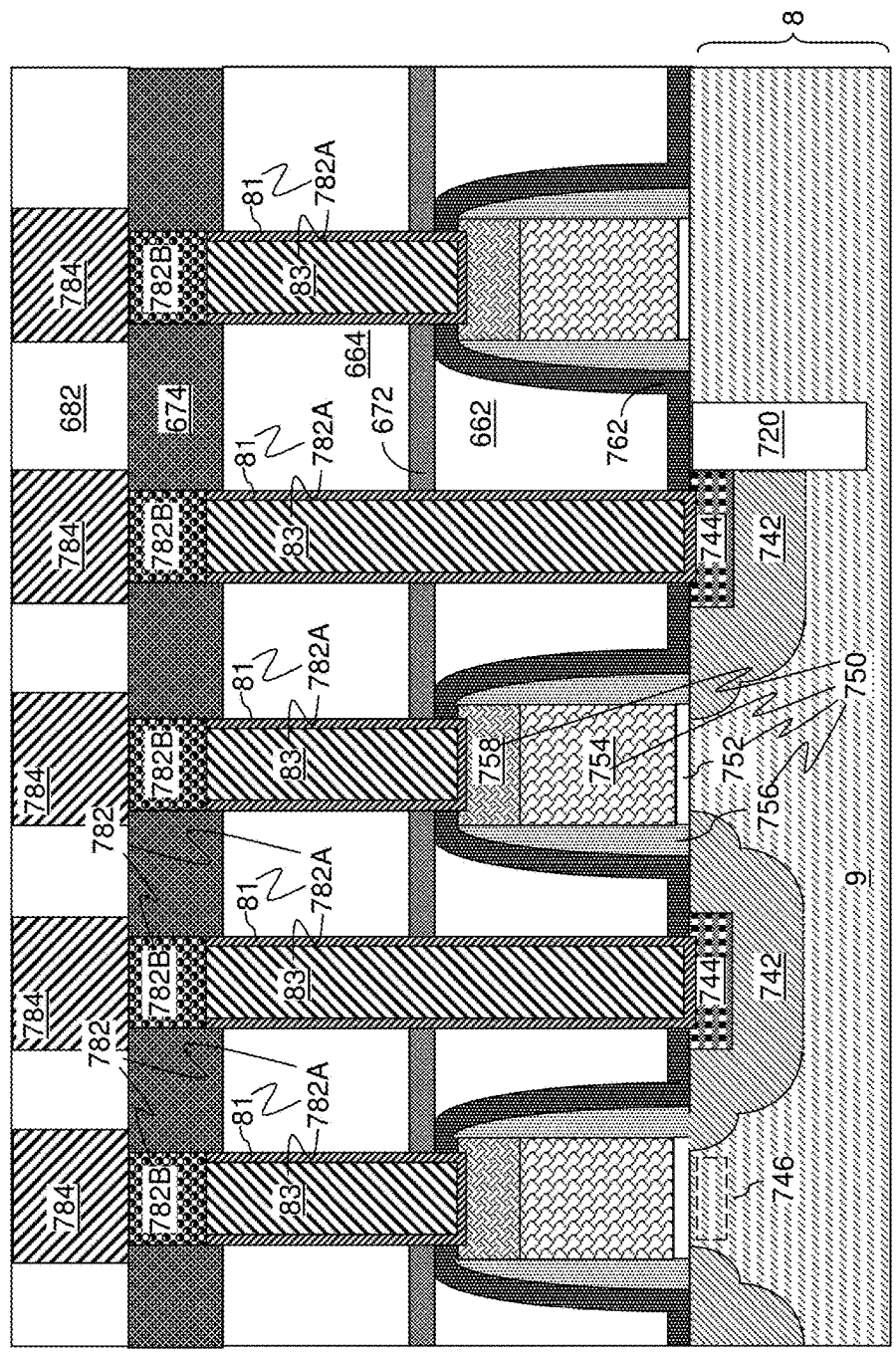
FIG. 8B is a third alternative embodiment of the exemplary structure of FIG. 7A.

Referring to FIG. 8B, a third alternative embodiment of the exemplary structure of FIG. 7A is illustrated, which can be derived from the first alternative embodiment of the exemplary structure of FIG. 7B by omitting the optional dielectric cap layer 666. In this case, the top surface of the silicon nitride layer 674 can be coplanar with the top surfaces of the contact via structures 782, and contact the bottom surface of the first line level lower dielectric material layer 682.

Referring to FIG. 9, additional lower level dielectric material layers and additional lower metal interconnect structures can be subsequently formed on any embodiment of the exemplary structure illustrated in FIG. 7A, 7B, 8A or 8B. The set of all dielectric material layers including the substrate capping silicon nitride layer 762, the planarization dielectric layer, the planar silicon nitride spacer layer, the contact level silicon oxide layer, the silicon nitride layer, the dielectric cap layer, the first line level lower dielectric material layer, and the additional lower level dielectric material layers are collectively referred to as lower level dielectric layers 760. The lower level dielectric layers 760 constitute a dielectric layer stack in which each component dielectric layer overlies or underlies other component dielectric layer(s). The lower level dielectric layers 760 can include an etch stop silicon nitride layer 766, first dielectric material layers 764, and at least one second dielectric layer 768 that overlies the etch stop silicon nitride layer 766. The first dielectric material layers 764 include all layers above the substrate capping silicon nitride layer 762 and below the etch stop silicon nitride layer 766 described above.

The dielectric layer stack including the lower level dielectric layers 760 functions as a matrix for lower metal interconnect structures 780 that provide electrical wiring among the various nodes of the semiconductor devices and landing pads for through-stack contact via structures to be subsequently formed. The lower metal interconnect structures 780 are embedded within the dielectric layer stack of the lower level dielectric layers 760.

For example, the lower metal interconnect structures 780 can be embedded within the first dielectric material layers 764. Various elements of the lower metal interconnect structures 780 are embedded within the first dielectric material layers 764. The additional lower level dielectric material layers above the silicon nitride layer 674 among the first dielectric material layers 764 may include any of doped silicate glass, undoped silicate glass, organosilicate glass, silicon nitride, silicon oxynitride, and dielectric metal oxides (such as aluminum oxide).

The lower metal interconnect structures 780 include the contact via structures 782, the first level lower line structures 784, lower metal via structures 786, optional intermediate level lower line structures 785, and topmost lower metal line structures 788 that are configured to function as landing pads for through-stack contact via structures to be subsequently formed. In this case, the first dielectric material layers 764 may be formed level by level while incorporating components of the lower metal interconnect structures 780 within each respective level. For example, single damascene processes may be employed to form the lower metal interconnect structures 780, and each level of the lower metal via structures 786 may be embedded within a respective via level dielectric material layer and each level of the lower level metal line structures (784, 788) may be embedded within a respective line level dielectric material layer. Alternatively, a dual damascene process may be employed to form integrated line and via structures, each of which includes a lower metal line structure and at least one lower metal via structure.

The topmost lower metal line structures 788 can be formed within a topmost dielectric material layer of the first dielectric material layers 764 (which can be a plurality of dielectric material layers). Each of the lower metal interconnect structures 780 may, or may not, include a metallic nitride liner and a metal fill portion. Each metallic nitride liner can include a conductive metallic nitride material such as TiN, TaN, and/or WN. Each metal fill portion can include an elemental metal (such as Cu, W, Al, Co, Ru) or an intermetallic alloy of at least two metals. Top surfaces of the topmost lower metal line structures 788 and the topmost surface of the first dielectric material layers 764 may be planarized by a planarization process, such as chemical mechanical planarization. In this case, the top surfaces of the topmost lower metal line structures 788 and the topmost surface of the first dielectric material layers 764 may be within a horizontal plane that is parallel to the top surface of the substrate 8.

The etch stop silicon nitride layer 766 can be formed directly on the top surfaces of the topmost lower metal line structures 788 and the topmost surface of the first dielectric material layers 764. Alternatively, a portion of the first dielectric material layers 764 can be located on the top surfaces of the topmost lower metal line structures 788 below the etch stop silicon nitride layer 766. In one embodiment, the etch stop silicon nitride layer 766 is a substantially stoichiometric silicon nitride layer which has a composition of $Si_3N_4$.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and a planar semiconductor material layer 10. The optional planar conductive material layer 6, if present, provides a high conductivity conduction path for electrical current that flows into, or out of, the planar semiconductor material layer 10. The optional planar conductive material layer 6 includes a conductive material such as a metal (e.g., tungsten), a metal compound (e.g., TiN or metal silicide, such as tungsten silicide), or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. In one embodiment, the planar conductive material layer 6 may function as a source line in the completed memory device. Alternatively or additionally, the planar conductive material layer 6 may comprise an etch stop layer and may comprise any suitable conductive, semiconducting, or insulating layer.

The planar semiconductor material layer 10 can include horizontal semiconductor channels and/or source regions for a three-dimensional array of memory devices to be subsequently formed. The thickness of the optional planar conductive material layer 6 may be in a range from 5 nm to 100 nm, although lesser and greater thicknesses can also be employed. The thickness of the planar semiconductor material layer 10 may be in a range from 30 nm to 300 nm, although lesser and greater thicknesses can also be employed.

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon or polycrystalline silicon germanium alloy), or an amorphous semiconductor material (such as amorphous silicon or silicon germanium alloy) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate semiconductor layer 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

The optional planar conductive material layer 6 and the planar semiconductor material layer 10 may be patterned to provide openings in areas in which through-stack contact via structures and through-dielectric contact via structures are to be subsequently formed. In one embodiment, the openings in the optional planar conductive material layer 6 and the planar semiconductor material layer 10 can be formed within the area of a memory array region 100, in which a three-dimensional memory array including memory stack structures is to be subsequently formed. Further, additional openings in the optional planar conductive material layer 6 and the planar semiconductor material layer 10 can be formed within the area of a contact region 200 in which contact via structures contacting word line electrically conductive layers are to be subsequently formed.

The region of the semiconductor devices and the combination of the lower level dielectric layers 760 and the lower metal interconnect structures 780 is herein referred to an underlying peripheral device region 700, which is located underneath a memory-level assembly to be subsequently formed and includes peripheral devices for the memory-level assembly. The lower metal interconnect structures 780 are embedded in the lower level dielectric layers 760.

The lower metal interconnect structures 780 can be electrically shorted to active nodes (e.g., transistor active regions 742 or gate electrodes 750) of the semiconductor devices 710 (e.g., CMOS devices), and are located at the level of the lower level dielectric layers 760. Only a subset of the active nodes is illustrated in FIG. 9 for clarity. Through-stack contact via structures (not shown in FIG. 9) can be subsequently formed directly on the lower metal interconnect structures 780 to provide electrical connection to memory devices to be subsequently formed. In one embodiment, the pattern of the lower metal interconnect structures 780 can be selected such that the topmost lower metal line structures 788 (which are a subset of the lower metal interconnect structures 780 located at the topmost portion of the lower metal interconnect structures 780) can provide landing pad structures for the through-stack contact via structures to be subsequently formed.

Figure 10:
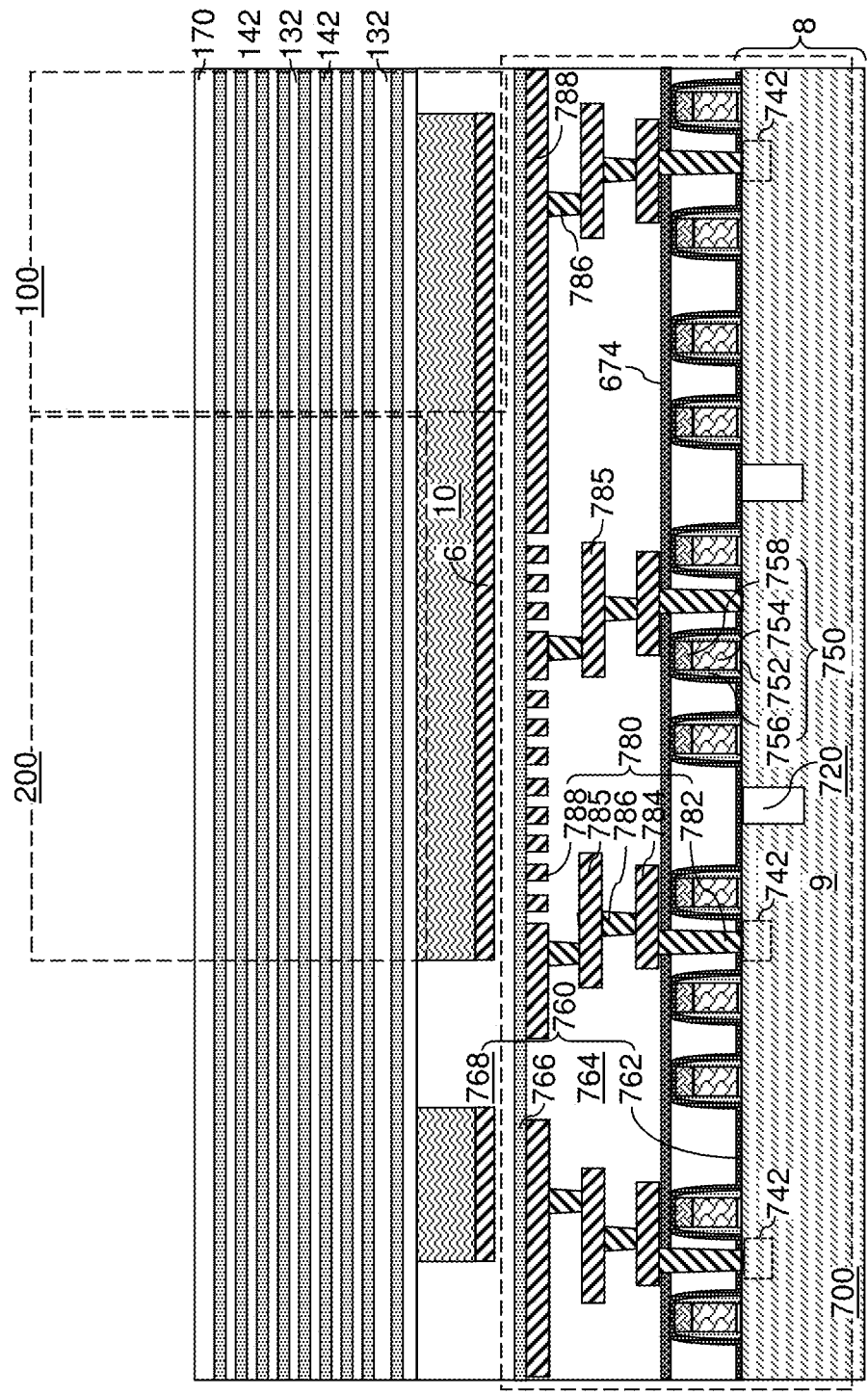
FIG. 10 is a vertical cross-sectional view of the exemplary structure after formation of a first-tier alternating stack of first insulting layers and first spacer material layers according to an embodiment of the present disclosure.

Referring to FIG. 10, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 11:
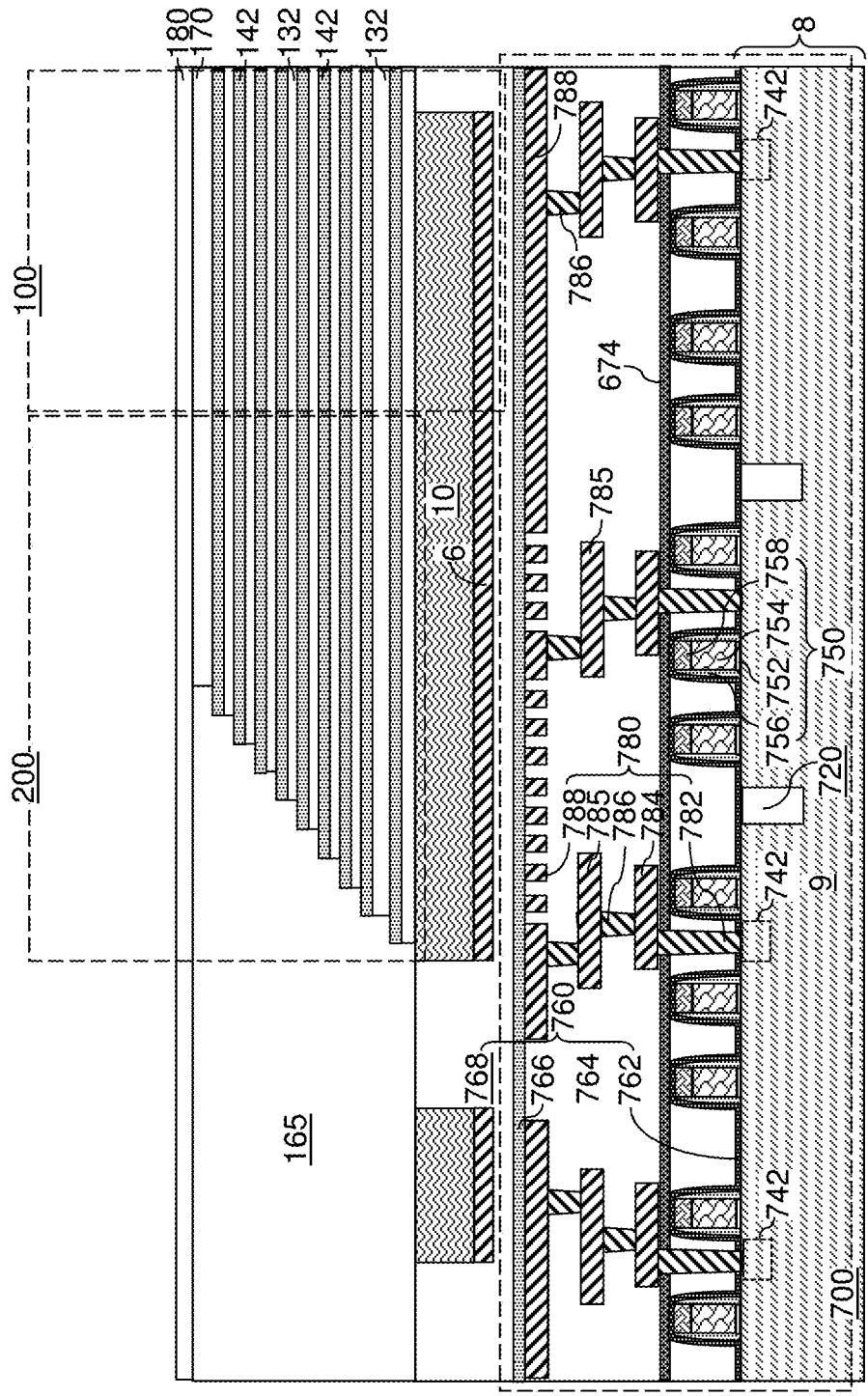
FIG. 11 is a vertical cross-sectional view of the exemplary structure after patterning first-tier staircase regions on the first-tier alternating stack and forming a first-tier retro-stepped dielectric material portion according to an embodiment of the present disclosure.

Referring to FIG. 11, the first insulating cap layer 170 and the first-tier alternating stack (132, 142) can be patterned to form first stepped surfaces in the word line contact via region 200. The word line contact via region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first-tier structure, which is an in-process structure that is subsequently modified. The first-tier retro-stepped dielectric material portion 165 is a memory level dielectric material portion, i.e., a dielectric material portion formed at memory levels at which memory cells are to be subsequently formed, and is formed over the planar semiconductor material layer 10 at levels of the first-tier alternating stack (132, 142).

Figure 12A:
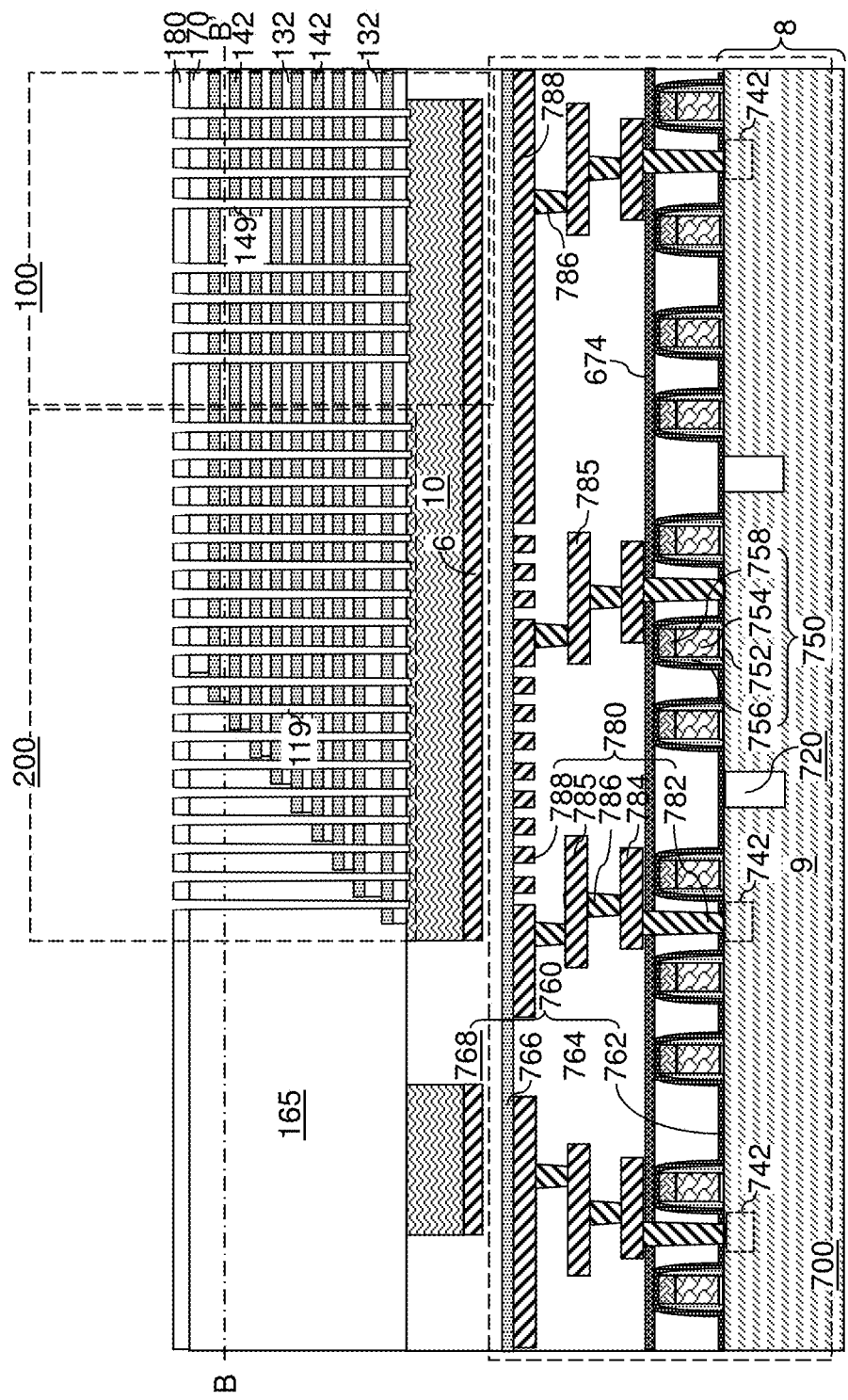
FIG. 12A is a vertical cross-sectional view of the exemplary structure after formation of first-tier memory openings and first tier support openings according to an embodiment of the present disclosure.

Referring to FIGS. 12A and 12B, an inter-tier dielectric layer 180 may be optionally deposited over the first-tier structure (132, 142, 165, 170). The inter-tier dielectric layer 180 includes a dielectric material such as silicon oxide. The thickness of the inter-tier dielectric layer 180 can be in a range from 30 nm to 300 nm, although lesser and greater thicknesses can also be employed. Locations of steps S in the first-tier alternating stack (132, 142) are illustrated as dotted lines.

First-tier memory openings 149 and first tier support openings 119 can be formed. The first-tier memory openings 149 and the first-tier support openings 119 extend through the first-tier alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line contact via region 200. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that employs the patterned lithographic material stack as an etch mask. Portions of the first insulating cap layer 170 (and the optional inter-tier dielectric layer 180), and the first-tier alternating stack (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first-tier alternating stack (132, 142) forms the first-tier memory openings 149 and the first-tier support openings 119.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 and the support openings 119 can be substantially vertical, or can be tapered. Subsequently, the patterned lithographic material stack can be subsequently removed, for example, by ashing.

Optionally, the portions of the first-tier memory openings 149 and the first-tier support openings 119 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. The portions of the first-tier memory openings 149 (and the first-tier support openings 119) located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 13:
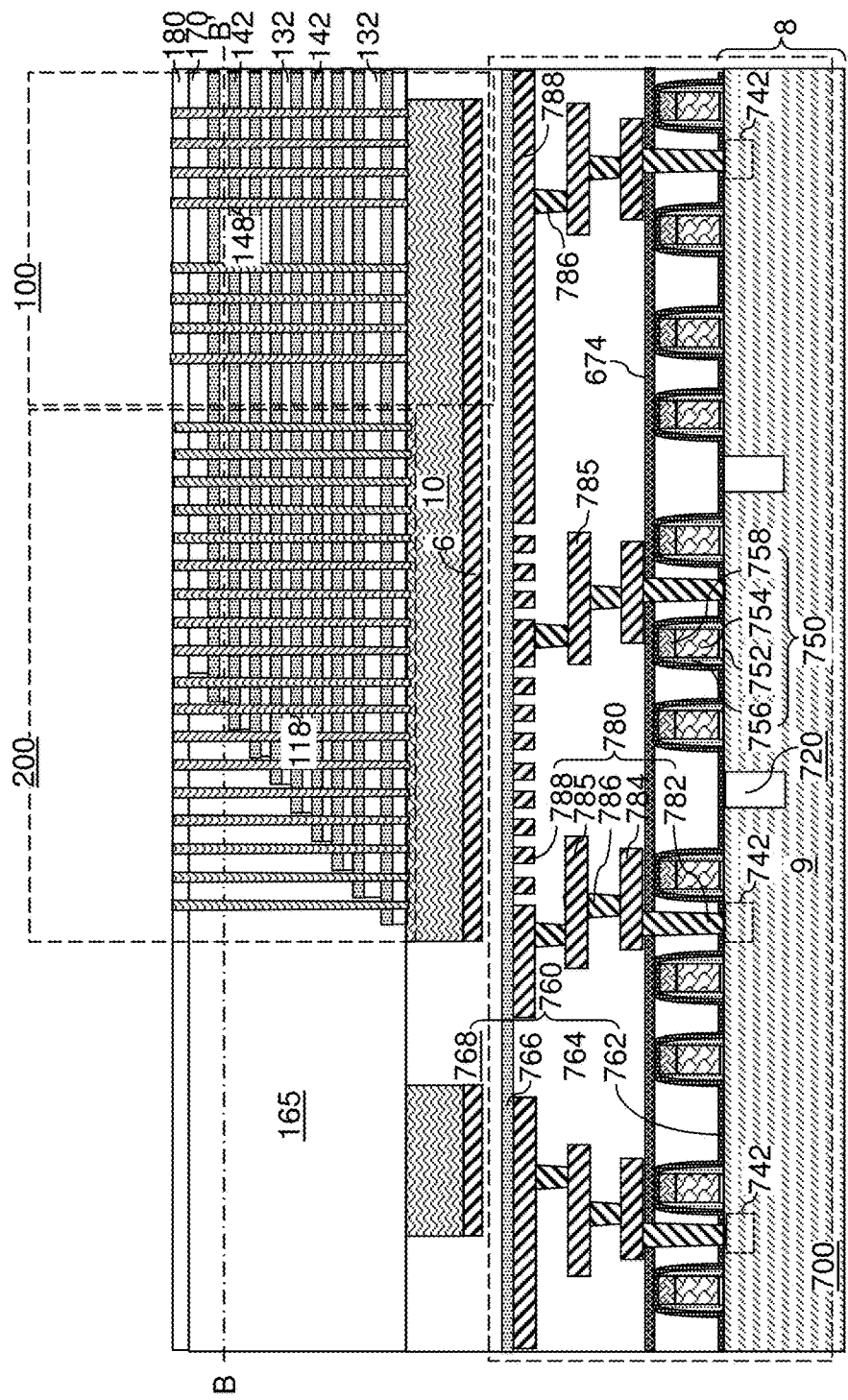
FIG. 13 is a vertical cross-sectional view of the exemplary structure after formation of sacrificial memory opening fill portions and sacrificial support opening fill portions according to an embodiment of the present disclosure.

Referring to FIG. 13, sacrificial memory opening fill portions 148 can be formed in the first-tier memory openings 149, and sacrificial support opening fill portions 118 can be formed in the first-tier support openings 119. For example, a sacrificial fill material layer is deposited in the first-tier memory openings 149 and the first-tier support openings 119. The sacrificial fill material layer includes a sacrificial material which can be subsequently removed selective to the materials of the first insulator layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating layer 170 (and optionally layer 180 if present) can be employed as an etch stop layer or a planarization stop layer. Each remaining portion of the sacrificial material in a first-tier memory opening 149 constitutes a sacrificial memory opening fill portion 148. Each remaining portion of the sacrificial material in a first-tier support opening 119 constitutes a sacrificial support opening fill portion 118. The top surfaces of the sacrificial memory opening fill portions 148 and the sacrificial support opening fill portions 118 can be coplanar with the top surface of the inter-tier dielectric layer 180 (or the first insulating cap layer 170 if the inter-tier dielectric layer 180 is not present). The sacrificial memory opening fill portion 148 and the sacrificial support opening fill portions 118 may, or may not, include cavities therein.

Figure 14:
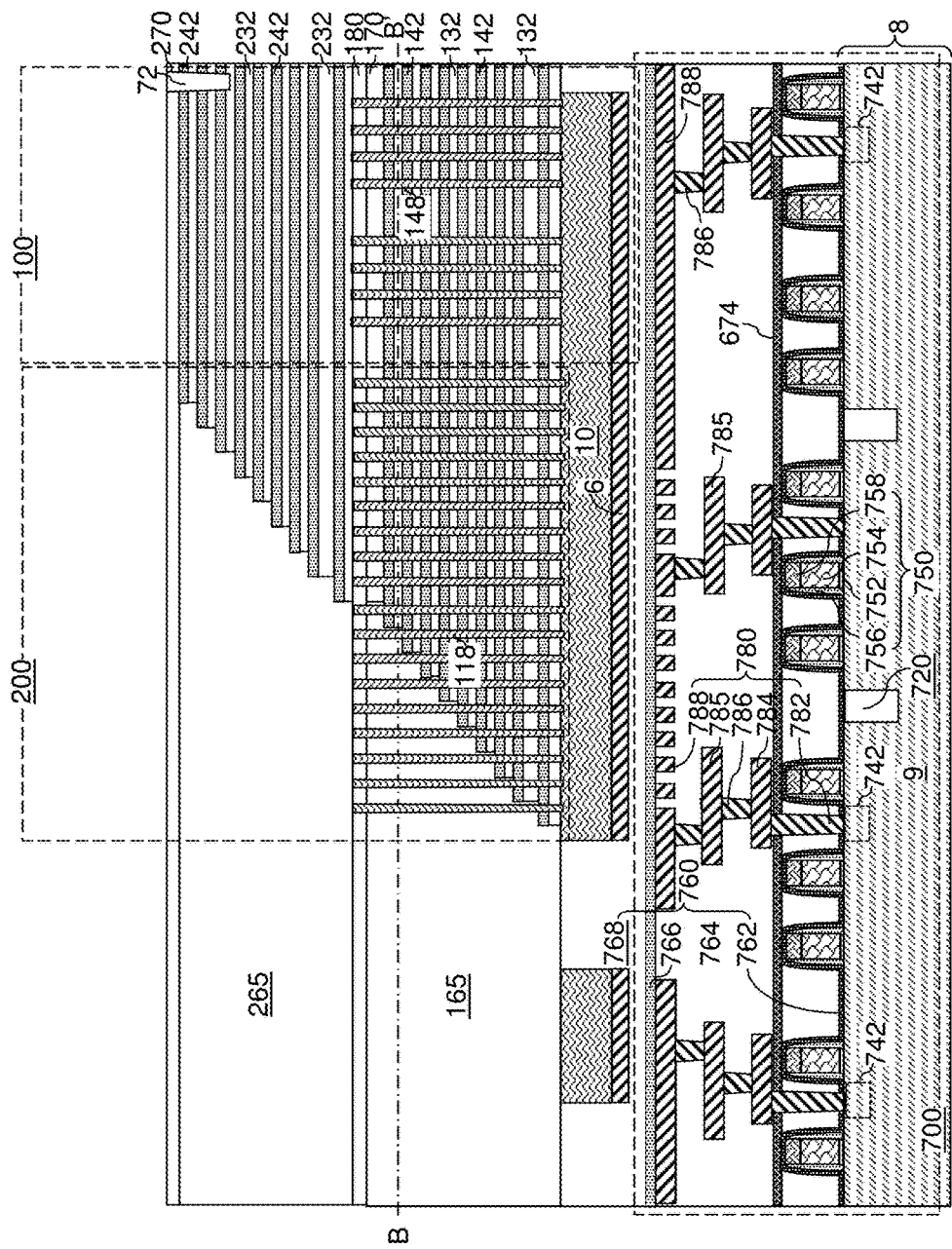
FIG. 14 is a vertical cross-sectional view of the exemplary structure after formation of a second-tier alternating stack of second insulating layers and second spacer material layers, a second-tier retro-stepped dielectric material portion, and a second insulating cap layer according to an embodiment of the present disclosure.

Referring to FIG. 14, a second-tier structure can be formed over the first-tier structure (132, 142, 170, 148, 118). The second-tier structure can include an additional alternating stack of insulating layers and spacer material layers, which can be sacrificial material layers. For example, a second-tier alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the word line contact via region 200 employing a same set of processing steps as the processing steps employed to form the first stepped surfaces in the first stepped area with suitable adjustment to the pattern of at least one masking layer. A second-tier retro-stepped dielectric material portion 265 can be formed over the second stepped surfaces in the word line contact via region 200. The second-tier retro-stepped dielectric material portion 265 is a memory level dielectric material portion, i.e., a dielectric material portion formed at memory levels at which memory cells are to be subsequently formed, and is formed over the planar semiconductor material layer 10 at levels of the second-tier alternating stack (232, 242).

A second insulating cap layer 270 can be subsequently formed over the second-tier alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 15A:
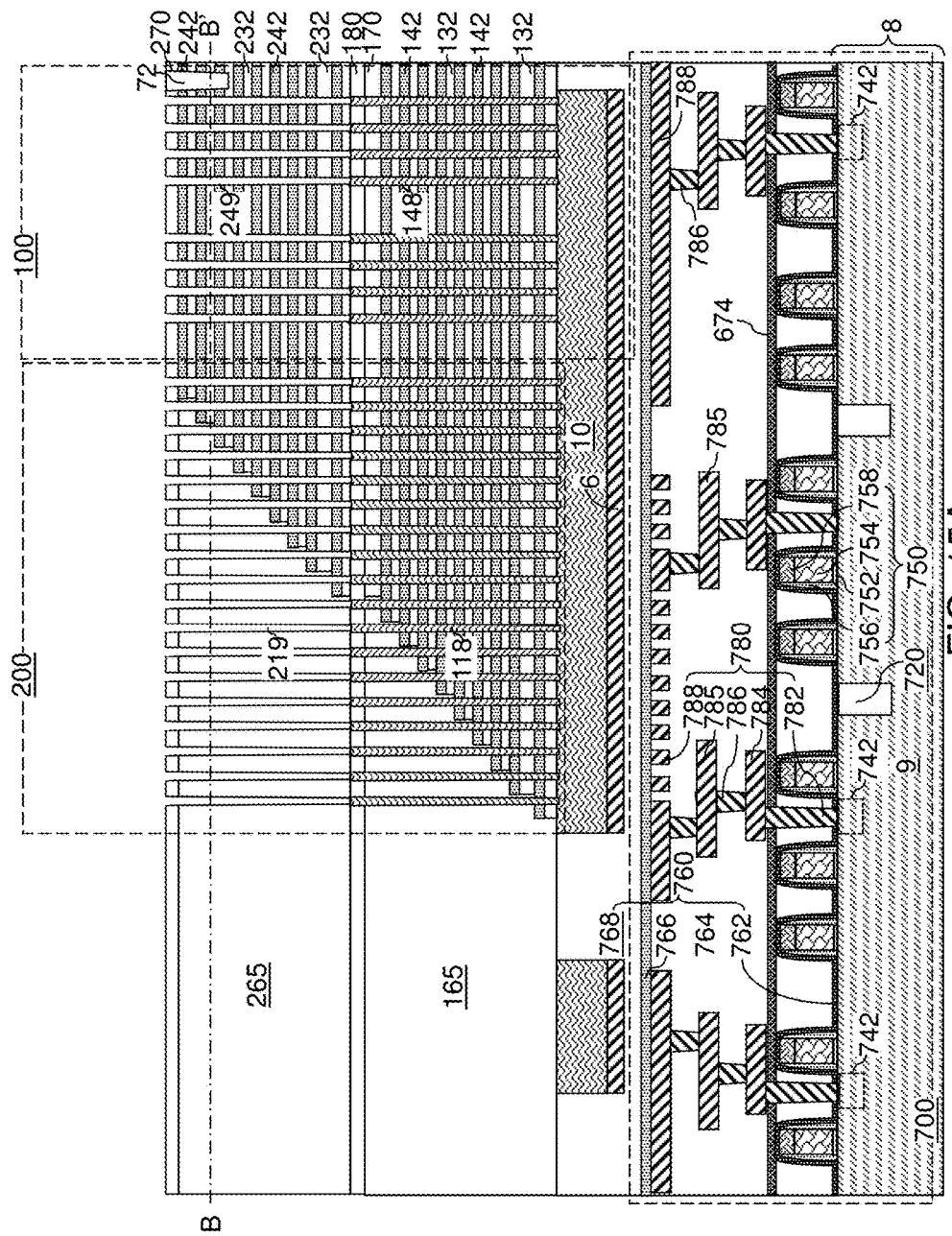
FIG. 15A is a vertical cross-sectional view of the exemplary structure after formation of inter-tier memory openings and inter-tier support openings according to an embodiment of the present disclosure.

Referring to FIGS. 15A and 15B, second-tier memory openings 249 and second-tier support openings 219 extending through the second-tier structure (232, 242, 270, 265) are formed in areas overlying the sacrificial memory opening fill portions 148. A photoresist layer can be applied over the second-tier structure (232, 242, 270, 265), and can be lithographically patterned to form a same pattern as the pattern of the sacrificial memory opening fill portions 148 and the sacrificial support opening fill portions 118, i.e., the pattern of the first-tier memory openings 149 and the first-tier support openings 119. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying sacrificial support opening fill portion 118 can be physically exposed at the bottom of each second-tier support opening 219. After the top surfaces of the sacrificial memory opening fill portions 148 and the sacrificial support opening fill portions 118 are physically exposed, an etch process can be performed, which removes the sacrificial material of the sacrificial memory opening fill portions 148 and the sacrificial support opening fill portions 118 selective to the materials of the second-tier alternating stack (232, 242) and the first-tier alternating stack (132, 142) (e.g., $C_4F_8/O_2/Ar$ etch and/or a wet etch).

Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). Likewise, upon removal of the sacrificial support opening fill portions 118, each vertically adjoining pair of a second-tier support opening 219 and a first-tier support opening 119 forms a continuous cavity that extends through the first-tier alternating stack (132, 142) and the second-tier alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first-tier alternating stack (132, 142) and the second-tier alternating stack (232, 242) are illustrated as dotted lines.

Figure 16:
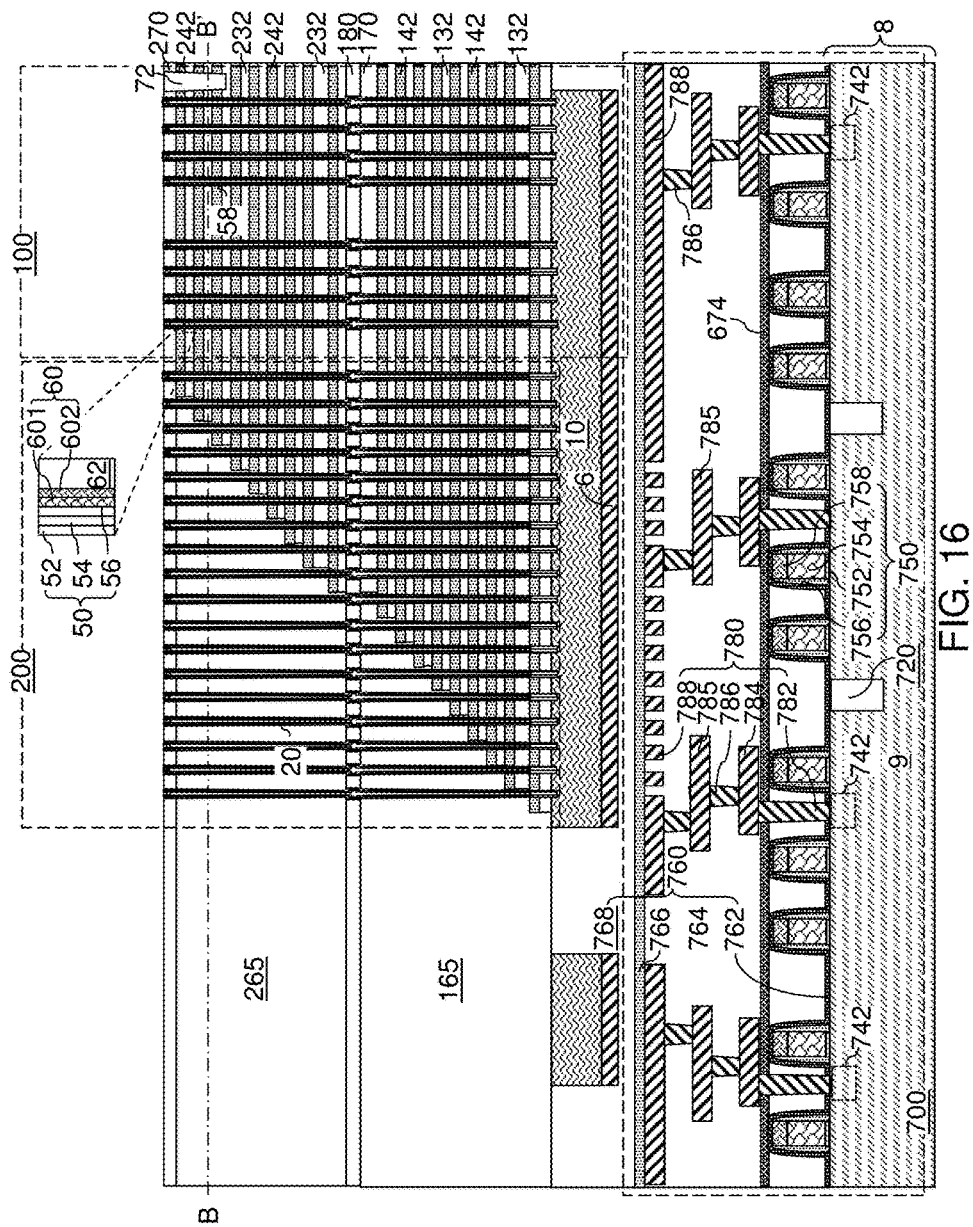
FIG. 16 is a vertical cross-sectional view of the exemplary structure after formation of memory stack structures according to an embodiment of the present disclosure.

Referring to FIG. 16, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 17A-17H provide sequential cross-sectional views of a memory opening 49 or a support opening (119, 219) during formation of a memory opening fill structure 58 or a support pillar structure 20. While a structural change in a memory opening 49 is illustrated in FIGS. 17A-17H, it is understood that the same structural change occurs in each memory openings 49 and in each of the support openings (119, 219) during the same set of processing steps.

Referring to FIG. 17A, a memory opening 49 in the exemplary device structure of FIG. 14 is illustrated. The memory opening 49 extends through the first-tier structure and the second-tier structure. Likewise, each support opening (119, 219) extends through the first-tier structure and the second-tier structure.

Referring to FIG. 17B, an optional pedestal channel portion (e.g., an epitaxial pedestal) 11 can be formed at the bottom portion of each memory opening 49 and each support openings (119, 219), for example, by a selective semiconductor deposition process. In one embodiment, the pedestal channel portion 11 can be doped with electrical dopants of the same conductivity type as the planar semiconductor material layer 10. In one embodiment, at least one source select gate electrode can be subsequently formed by replacing each sacrificial material layer 142 located below the horizontal plane including the top surfaces of the pedestal channel portions 11 with a respective conductive material layer. A cavity 49' is present in the unfilled portion of the memory opening 49 (or of the support opening) above the pedestal channel portion 11. In one embodiment, the pedestal channel portion 11 can comprise single crystalline silicon. In one embodiment, the pedestal channel portion 11 can have a doping of the same as the conductivity type of the planar semiconductor material layer 10.

Figure 17C:
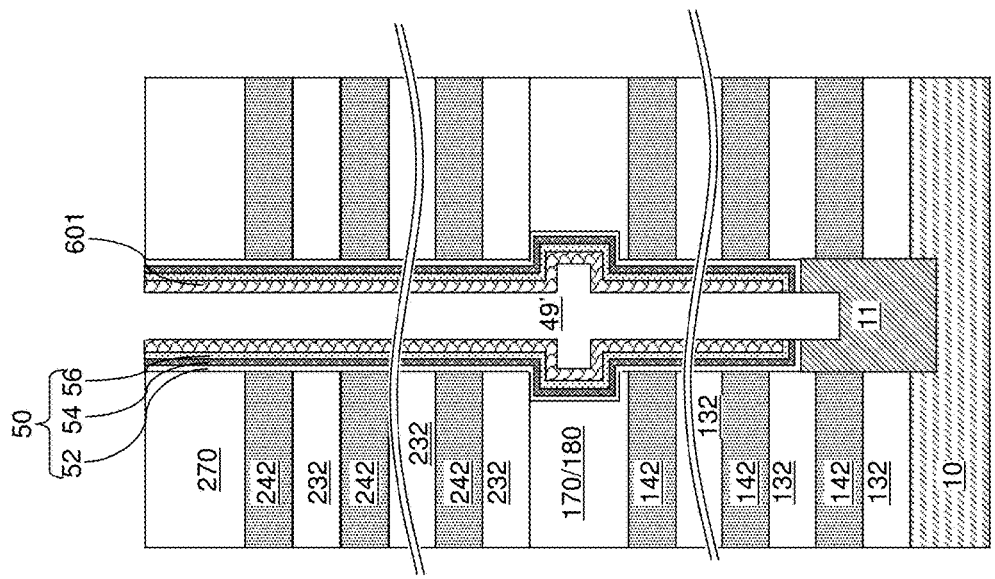

Referring to FIG. 17C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Figure 17D:
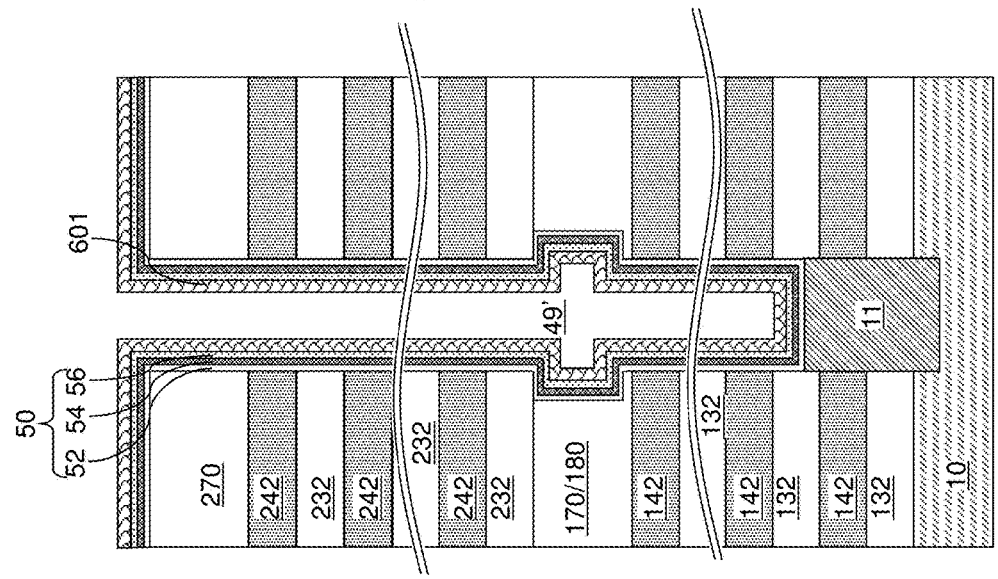

Referring to FIG. 17D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the planar semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 17E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602. In another embodiment, the first semiconductor channel layer 601 can be removed entirely prior to deposition of the second semiconductor channel layer 602. In this case, the semiconductor channel material includes only the second semiconductor channel layer 602.

Referring to FIG. 17F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 17G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirely within a memory opening 49 or entirely within a support opening (119, 219).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 17H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first-tier structure (132, 142, 170, 165), the second-tier structure (232, 242, 270, 265), the inter-tier dielectric layer 180, the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Figure 18A:
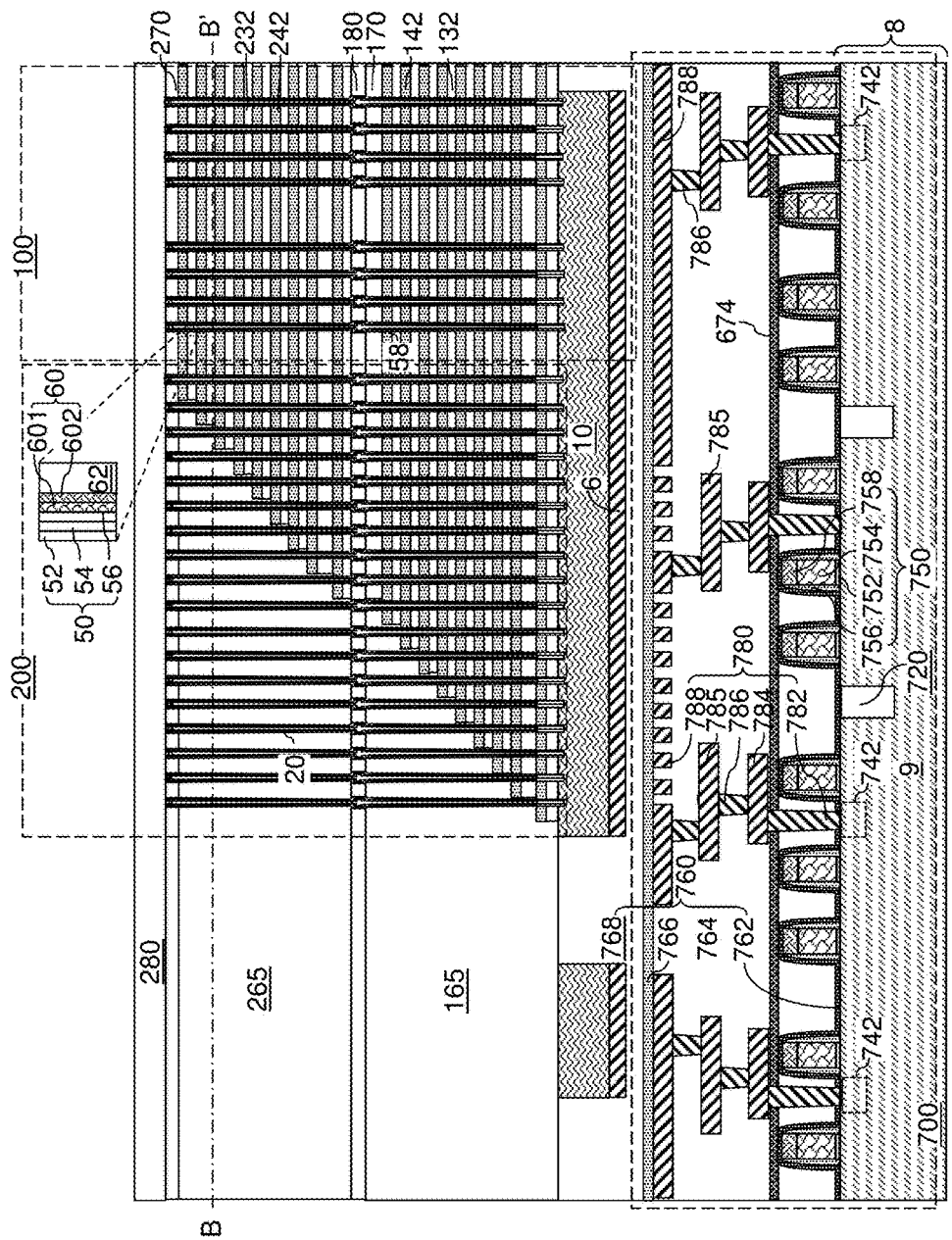
FIG. 18A is a vertical cross-sectional view of the exemplary structure after formation of first through-stack via cavities according to an embodiment of the present disclosure.

Referring to FIGS. 18A and 18B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Figure 19A:
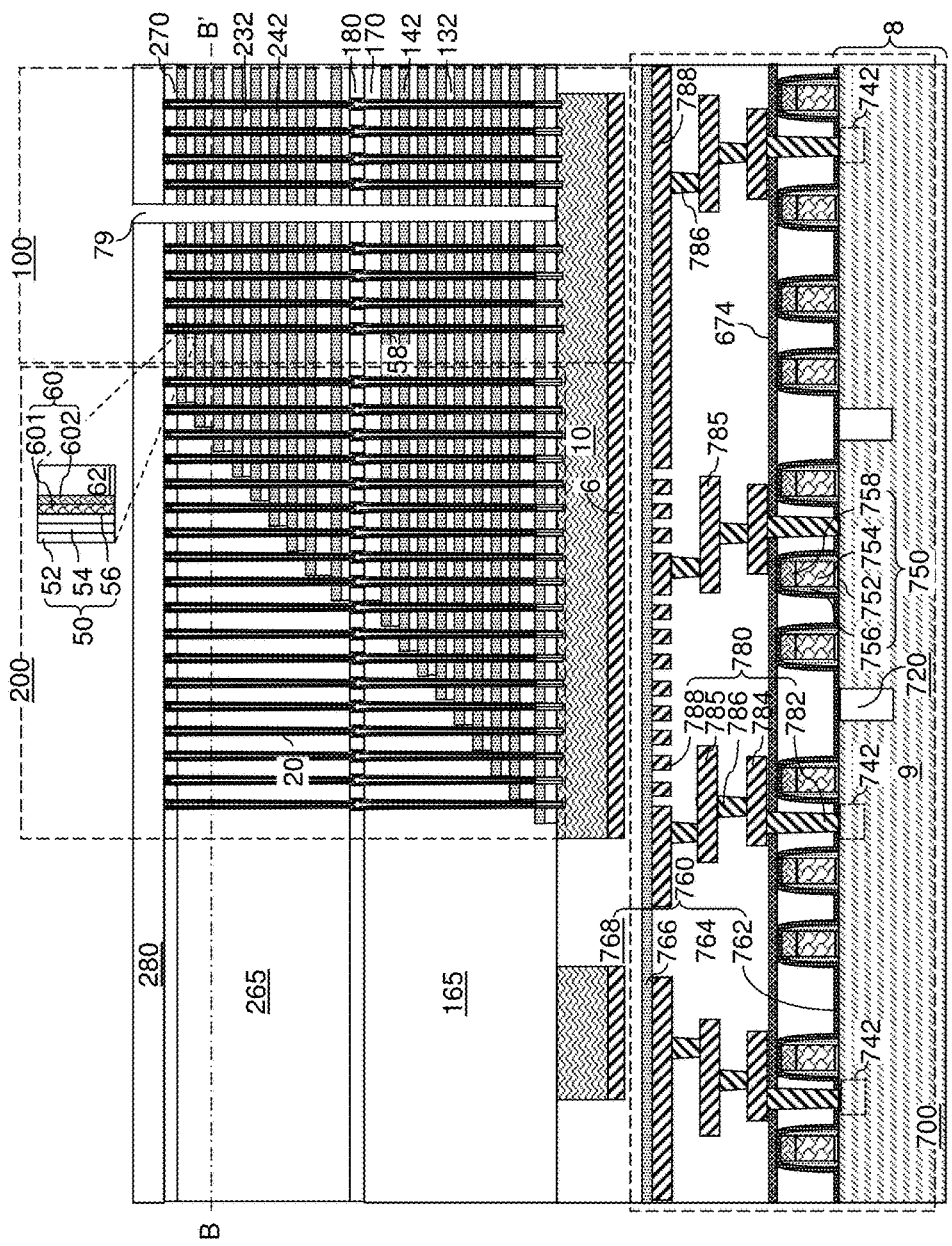
FIG. 19A is a vertical cross-sectional view of the exemplary structure after formation of backside contact trenches according to an embodiment of the present disclosure.
Figure 19B:
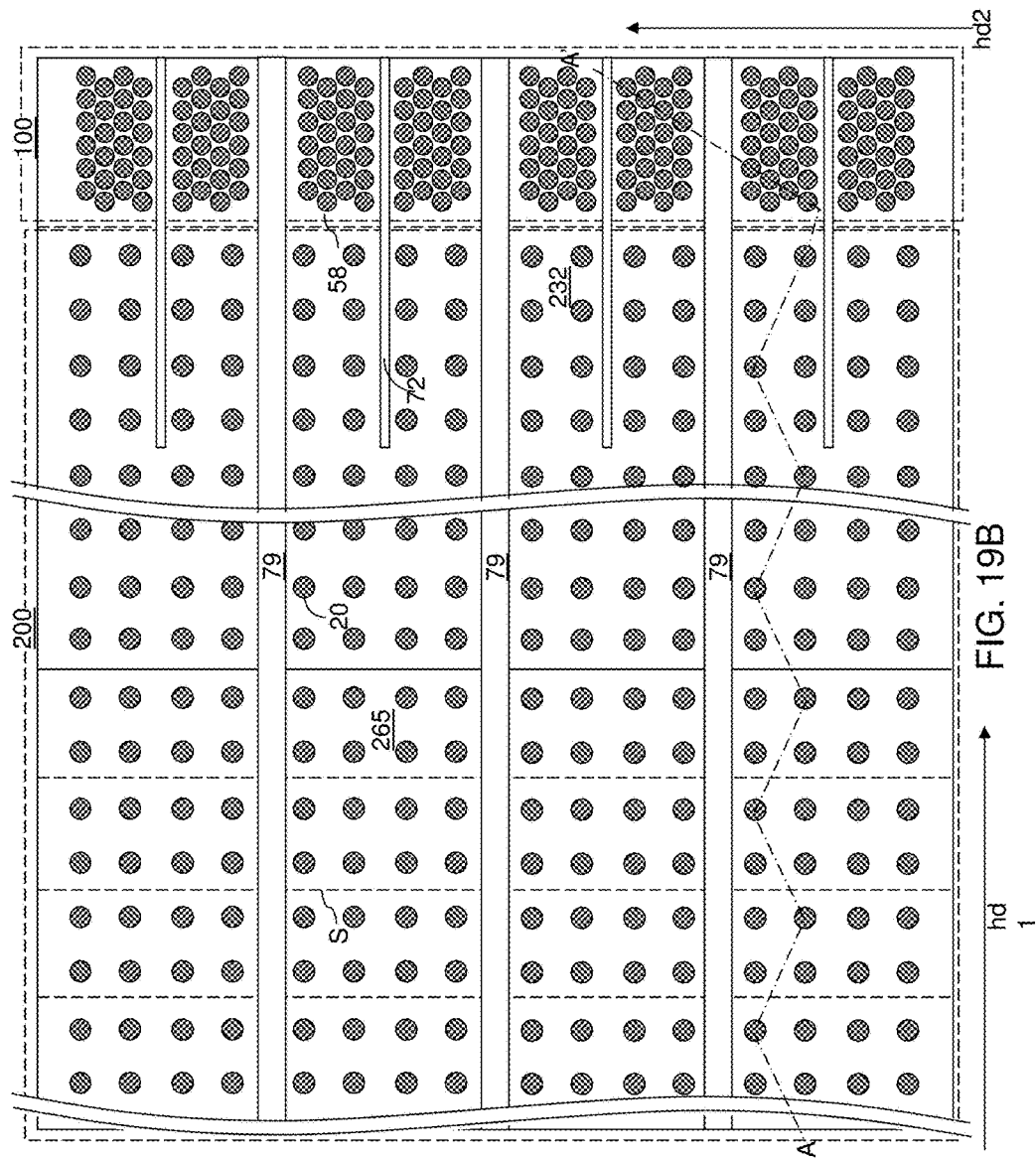
FIG. 19B is a horizontal cross-sectional view of the exemplary structure along the horizontal plane B-B' in FIG. 19A. The zig-zag vertical plane A-A' corresponds to the plane of the vertical cross-sectional view of FIG. 19A.

Referring to FIGS. 19A and 19B, backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced among one another along a second horizontal direction hd2, which can be perpendicular to the first horizontal direction hd1. The backside contact trenches 79 can extend through the memory array region (e.g., a memory plane) 100 and the word line contact via region 200.

The first subset of the backside contact trenches 79 laterally divides the memory-level assembly (e.g., into memory blocks).

Figure 20A:
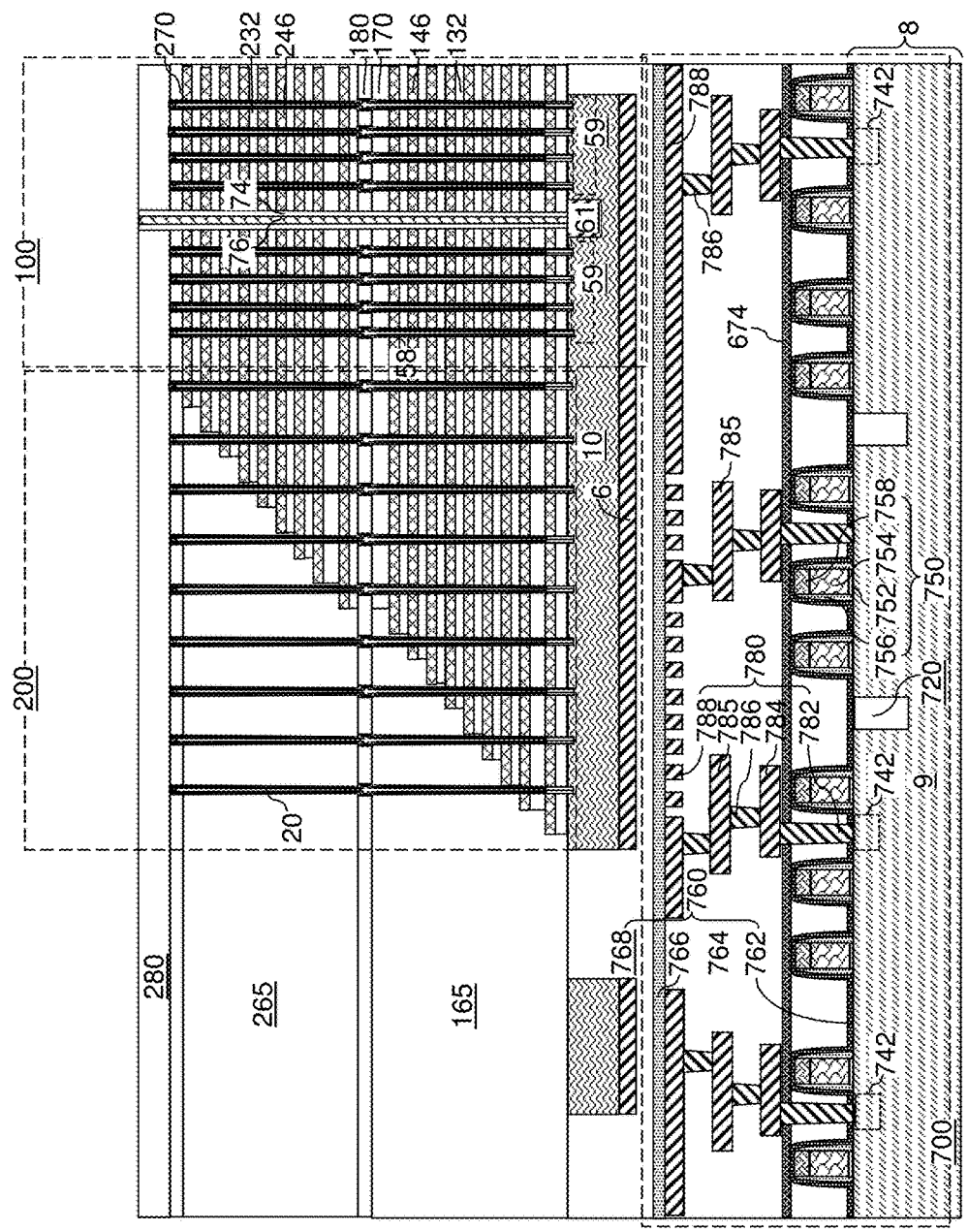
FIG. 20A is a vertical cross-sectional view of the exemplary structure after replacement of sacrificial material layers with electrically conductive layers and formation of insulating spacers and backside contact via structures according to an embodiment of the present disclosure.

Referring to FIGS. 20A and 20B, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, employing an isotropic etch process. First backside recesses are formed in volumes from which the first sacrificial material layers 142 are removed. Second backside recesses are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate semiconductor layer 9. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown) can be formed around each pedestal channel portion 11 by oxidation of a physically exposed peripheral portion of the pedestal channel portions 11. Further, a semiconductor oxide portion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the planar semiconductor material layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and is laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280. The first contact level dielectric layer 280 can be thinned and removed during a latter part of the planarization process, which may employ chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

Figure 21A:
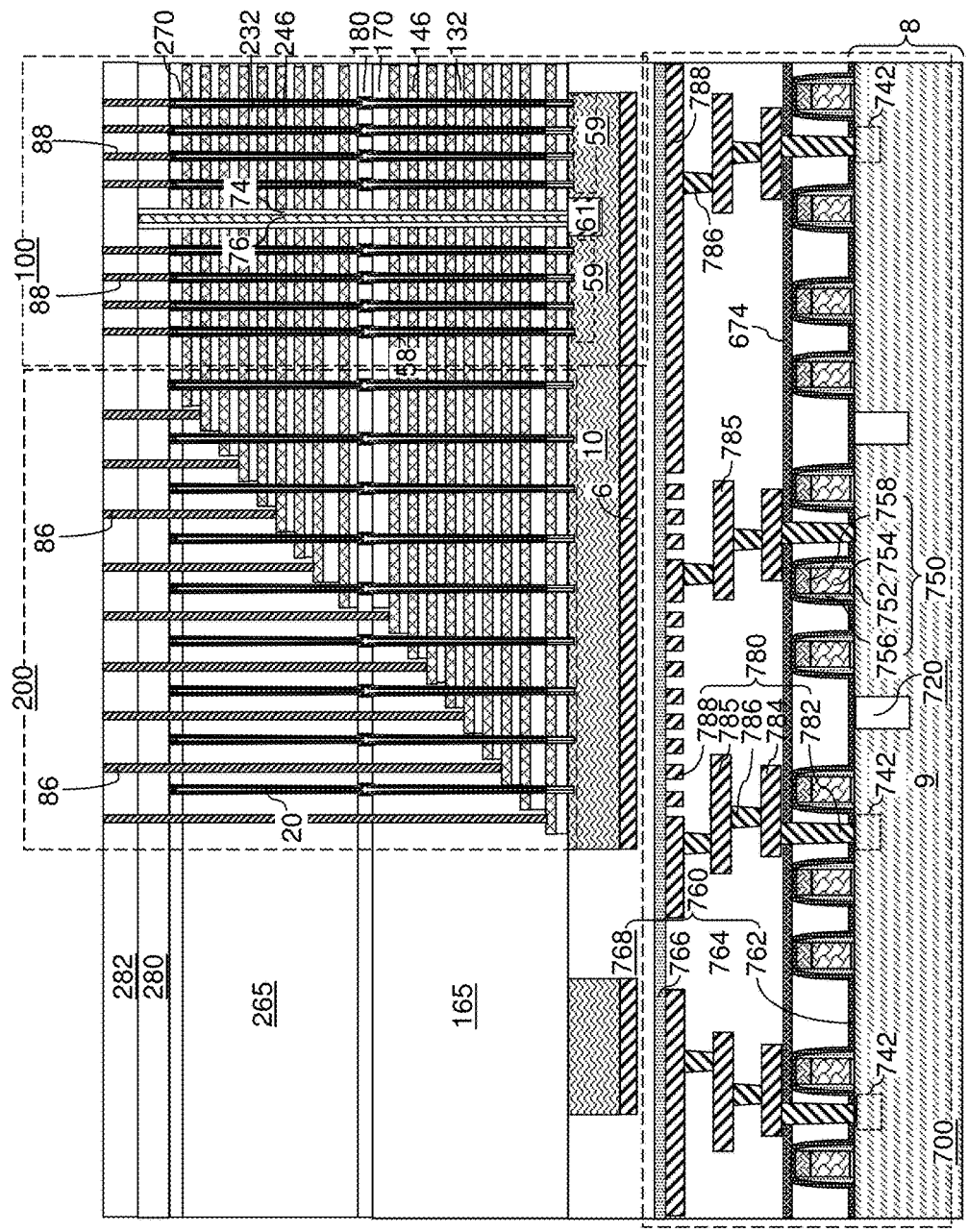
FIG. 21A is a vertical cross-sectional view of the exemplary structure after formation of drain contact via structures and word line contact via structures according to an embodiment of the present disclosure.

Referring to FIGS. 21A and 21B, a second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be employed.

Drain contact via structures 88 contacting the drain regions 63 can extend through the contact level dielectric layers (280, 282) and the second insulating cap layer 270 in the memory array region 100. A source connection via structure 91 can extend through the contact level dielectric layers (280, 282) to provide electrical connection to the laterally-elongated contact via structures 76.

Various contact via structures can be formed through the contact level dielectric layers (280, 282) and the retro-stepped dielectric material portions (165, 265). For example, word line contact via structures 86 can be formed in the word line contact region 200. A subset of the word line contact via structures 86 contacting the second electrically conductive layers 246 extends through the second-tier retro-stepped dielectric material portion 265 in the word line contact region 200, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in the word line contact region 200.

Figure 22:
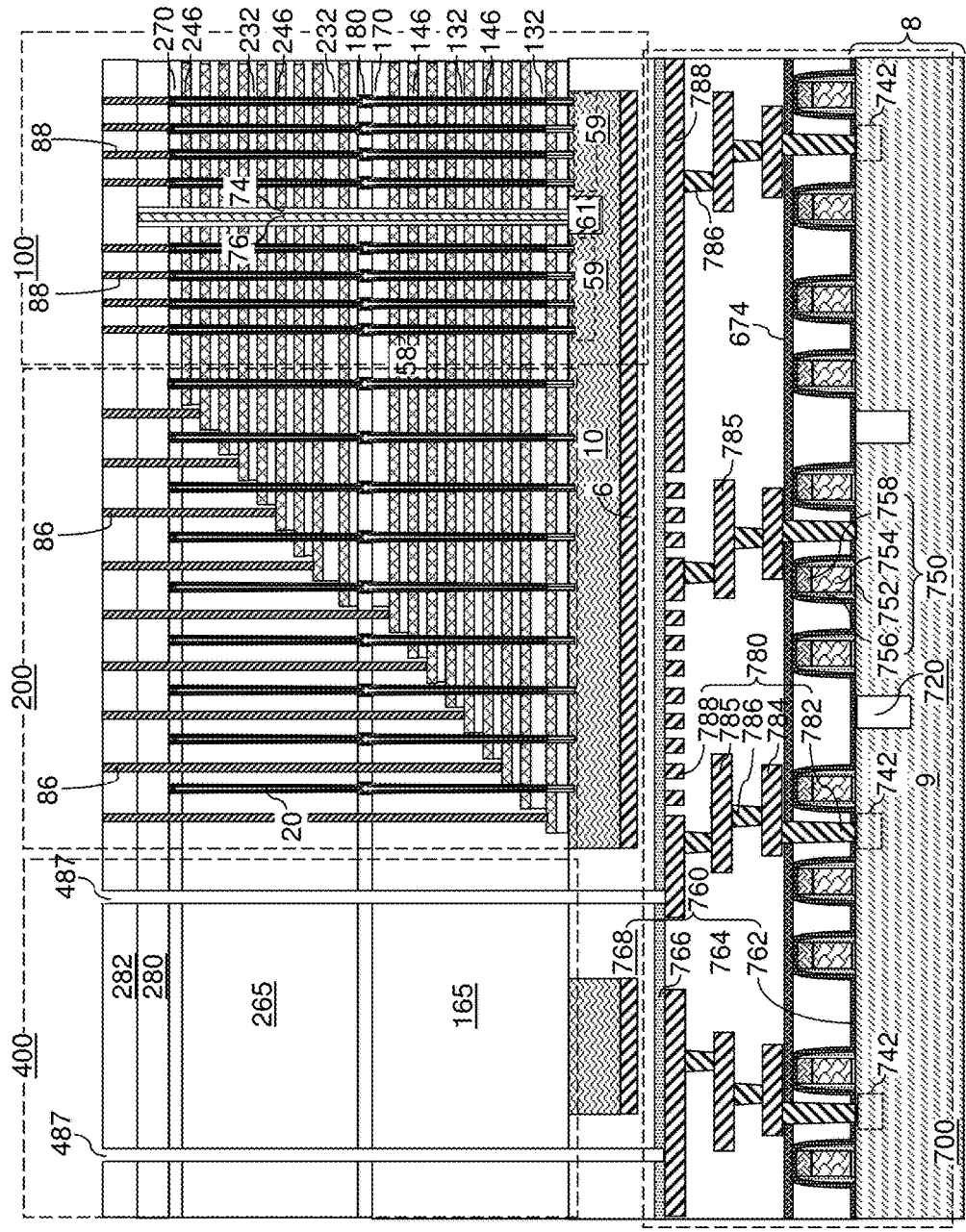
FIG. 22 is a vertical cross-sectional view of the exemplary structure after formation of second through-track via cavities and through-dielectric via cavities according to an embodiment of the present disclosure.

Referring to FIG. 22, a photoresist layer is applied over the second contact level dielectric layer 282, and is lithographically patterned to form openings in a peripheral region 400 located outside the memory array region 100 and the contact region 200. The pattern in the photoresist layer is transferred through the contact level dielectric layers (280, 282), the retro-stepped dielectric material portions (165, 265), the at least one second dielectric material layer 768, and the etch stop silicon nitride layer 766 to a top surface of a respective one of the topmost lower metal liner structures 788 to form through-dielectric via cavities 487 in the peripheral region 400. In one embodiment, the through-dielectric via cavities 487 can pass through openings in the planar semiconductor material layer 10 and the optional planar conductive material layer 6. The photoresist layer can be removed, for example, by ashing.

Figure 23A:
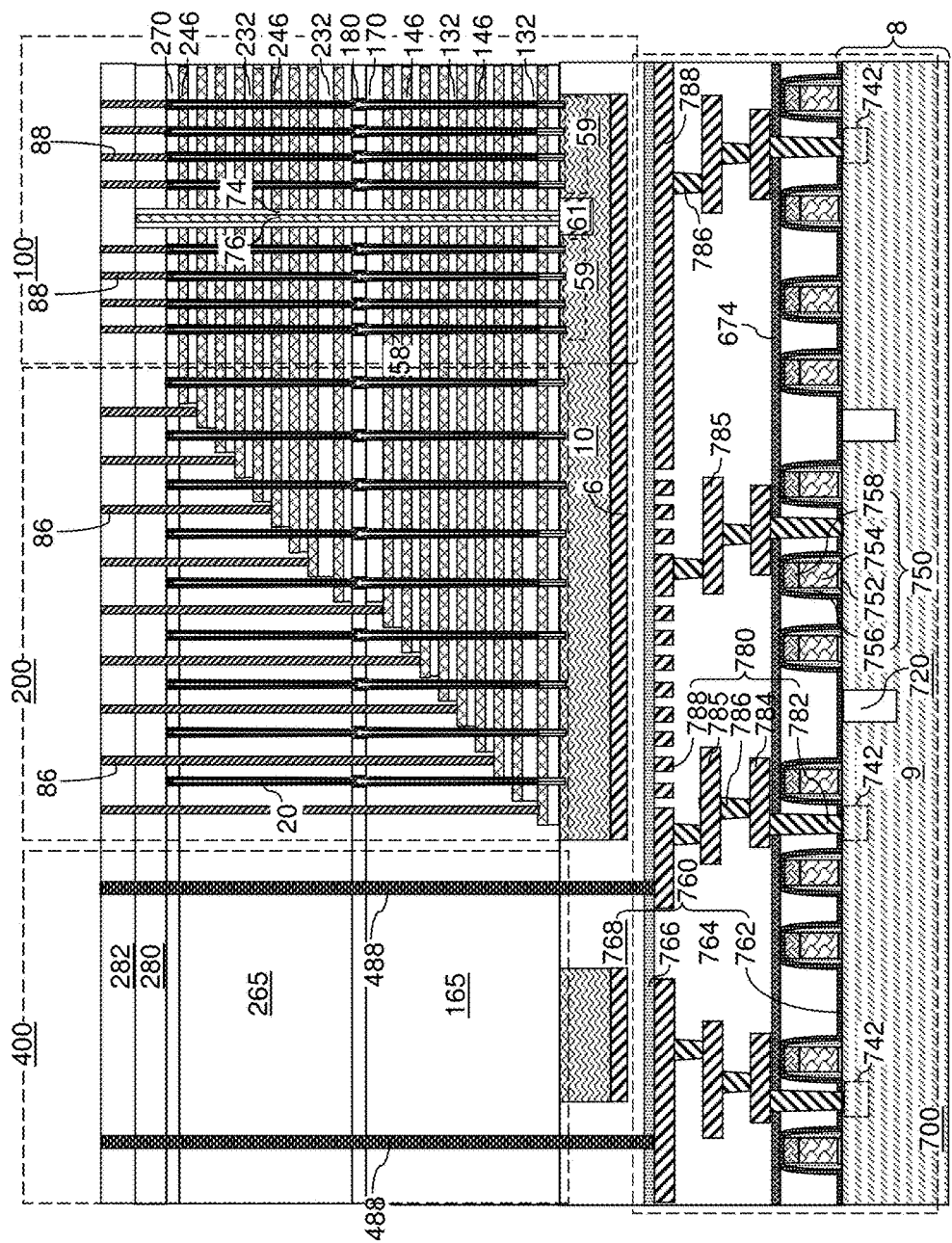
FIG. 23A is a vertical cross-sectional view of the exemplary structure after formation of through-stack contact via structures and through-dielectric contact via structures according to an embodiment of the present disclosure.

Referring to FIGS. 23A and 23B, at least one conductive material can be simultaneously deposited in the through-dielectric via cavities 487. The at least one conductive material can include, for example, a metallic nitride liner (such as a TiN liner) and a metal fill material (such as W, Cu, Al, Ru, or Co). Excess portions of the at least one conductive material can be removed from outside the through-dielectric via cavities 487. For example, excess portions of the at least one conductive material can be removed from above the top surface of the second contact level dielectric layer 282 by a planarization process such as chemical mechanical planarization and/or a recess etch. Each remaining portion of the at least one conductive material in the through-dielectric via cavities 487 that contacts a top surface of a respective one of the topmost lower metal line structure 788 constitutes a through-dielectric contact via structure 488.

Figure 24:
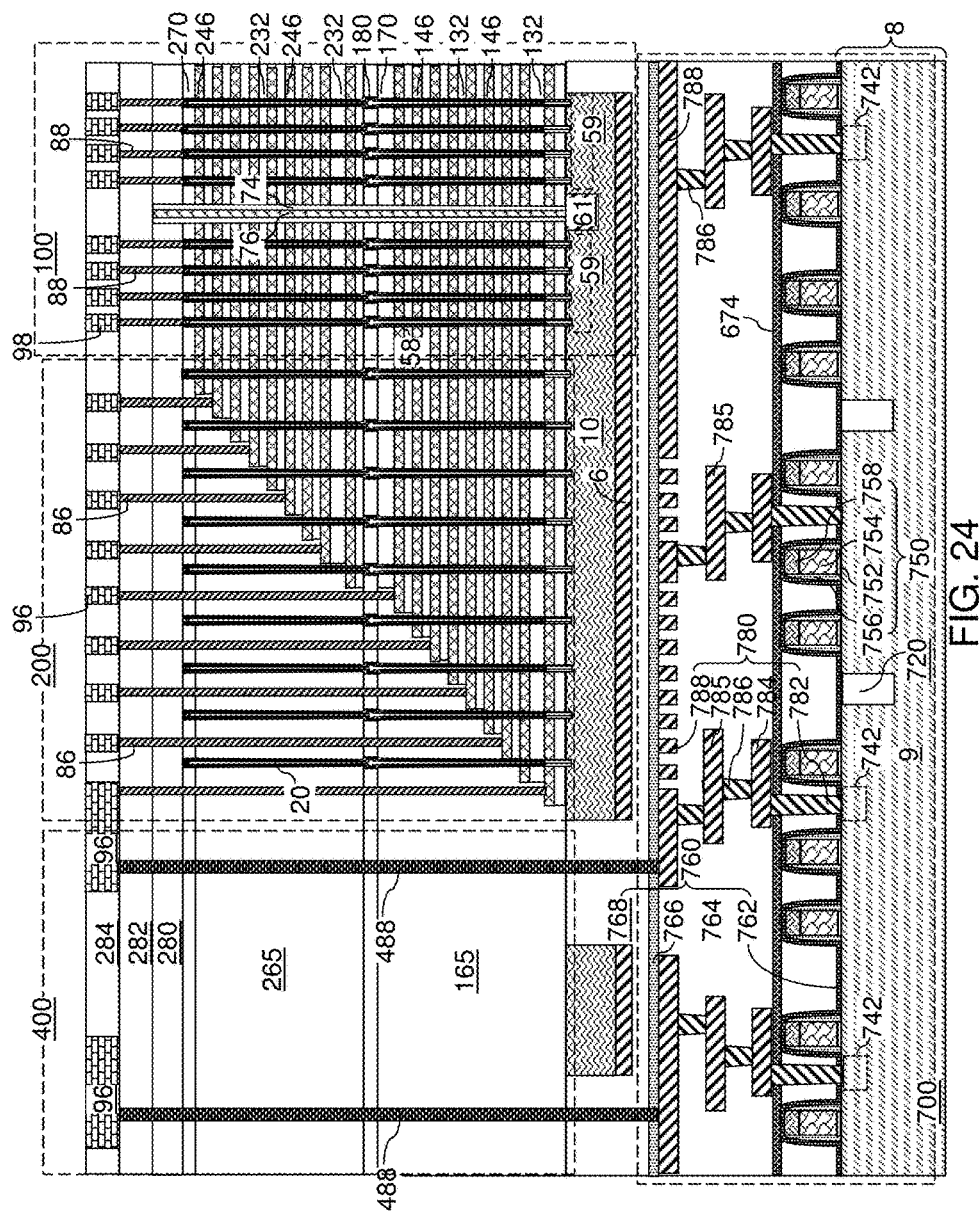
FIG. 24 is a vertical cross-sectional view of the exemplary structure after formation of upper metal line structures according to an embodiment of the present disclosure.

Referring to FIG. 24, at least one upper interconnect level dielectric layer 284 can be formed over the contact level dielectric layers (280, 282). Various upper interconnect level metal structures can be formed in the at least one upper interconnect level dielectric layer 284. For example, the various upper interconnect level metal structures can include line level metal interconnect structures (96, 98). The line level metal interconnect structures (96, 98) can include upper metal line structures 96 that contact a top surface of a respective one of the through-dielectric contact via structures 488, and bit lines 98 that contact a respective one of the drain contact via structures 88 and extend along the second horizontal direction (e.g., bit line direction) hd2 and perpendicular to the first horizontal direction (e.g., word line direction) hd1. In one embodiment, a subset of the upper metal line structures 96 may contact, or are electrically coupled to, a respective pair of a word line contact via structure 86 and a through-dielectric contact via structure 488.

At least a subset of the upper metal interconnect structures (which include the line level metal interconnect structures (96, 98) is formed over the three-dimensional memory array. A through-dielectric contact via structure 488 can be provided through the retro-stepped dielectric material portions (165, 265), the at least one second dielectric material layer 768, and the etch stop silicon nitride layer 766 and directly on a top surface of another lower metal line structure (e.g., another topmost lower metal line structure 788) of the lower metal interconnect structures 780. The etch stop silicon nitride layer 766 can function an additional hydrogen diffusion blocking structure that limits diffusion of hydrogen within the areas of the through-dielectric contact via structures 488.

According to various embodiments of the present disclosure, a semiconductor structure is provided, which comprises: a semiconductor device 710 located on a semiconductor substrate 8; a contact level silicon oxide layer overlying the semiconductor device 710; a silicon nitride layer 674 overlying the semiconductor device 710; a contact via structure 782 extending through the silicon nitride layer 674 and including a lower contact via structure portion 782A and an upper contact via structure portion 782B wherein a top surface 782T of the lower contact via structure portion is located in a horizontal plane located between two horizontal planes HP1 and HP2 containing respective top and bottom surfaces of the silicon nitride layer 674; a three-dimensional memory array overlying the silicon nitride layer 674 and including an alternating stack of insulating layers (132 or 232) and electrically conductive layers (246 or 246), and including memory stack structures 55 vertically extending through the alternating stack in a memory array region 100; and at least one metal interconnect structure (784, 785, 786, 788, 488, 86, 96, 98) overlying the contact via structure 782 and providing electrical connection between the contact via structure 782 and a node of the three-dimensional memory array.

In one embodiment, an entire periphery of an interface between the lower contact via structure portion 782A and the upper contact via structure portion 782B is on a sidewall surface of an opening through the silicon nitride layer 674 between an upper periphery of the sidewall surface and a lower periphery of the sidewall surface.

In one embodiment, a bottom surface of the upper contact via structure 782B contacts the top surface 782T of the lower contact via structure portion 782A. The bottom surface of the upper contact via structure is located in the horizontal plane located between the two horizontal planes (HP1, HP2) containing the respective top and bottom surfaces of the silicon nitride layer 764. A combination of the silicon nitride layer 764 and the upper contact via structure portion 782B function as a hydrogen diffusion barrier.

In one embodiment, the upper contact via structure portion 782B comprises at least one metallic diffusion barrier material selected from at least one of a metal silicide, titanium nitride and elemental titanium. In one embodiment, the upper contact via structure portion 782B comprises: a diffusion barrier liner 782L consisting essentially of a first metallic diffusion barrier material contacting the lower contact via structure portion 782A; and a diffusion barrier material portion 782F consisting essentially of a second metallic diffusion barrier material and embedded within the diffusion barrier liner 782L, wherein a top surface of the upper contact via structure 782B includes an annular top surface of the diffusion barrier layer 782L. In another embodiment, the upper contact via structure 782B consists essentially of a single metallic diffusion barrier material.

In one embodiment, the contact level silicon oxide layer 664 has a planar top surface located within a first horizontal plane HP1; the silicon nitride layer 674 has a planar top surface located within a second horizontal plane HP2; the semiconductor structure further comprises a dielectric cap layer 666 overlying the silicon nitride layer 674; and the contact via structure 672 extends through the dielectric cap layer 666, and a top surface of the upper contact via structure portion 782B is within a third horizontal plane HP3 including a top surface of the dielectric cap layer 666. In one embodiment, a vertical cross-sectional profile of a sidewall of the contact via structure 782 extends in a straight line between the third horizontal plane HP3 and a point at which the contact via structure 782 contacts the semiconductor device. In one embodiment, the dielectric cap layer 666 comprises silicon oxide.

In one embodiment, the semiconductor device comprises a field effect transistor including a gate electrode 754 overlying a top surface of the semiconductor substrate 8 and two active regions 742 embedded in the semiconductor substrate 8, and the semiconductor structure further comprises: a planarization dielectric layer 662 overlying the two active regions 742 and laterally surrounding the gate electrode 754 and having a planar top surface; and a planar silicon nitride spacer layer 672 located on the planar top surface of the planarization dielectric layer 662 and overlying the gate electrode 754 and contacting a bottom surface of the contact level silicon oxide layer 664. The contact via structure 782 extends through the planarization dielectric layer 662 and the planar silicon nitride spacer layer 672.

In one embodiment, the semiconductor structure further comprises: a metal silicide material portion (744, 758) located within the semiconductor device and contacting a bottom surface of the contact via structure 782; and a substrate capping silicon nitride layer 762 located between the planarization dielectric layer 662 and each of the semiconductor substrate 8 and the gate electrode 754, wherein the contact via structure 782 extends through the substrate capping silicon nitride layer 762.

In one embodiment, the lower contact via structure 782A comprises: a metallic nitride liner 81 comprising a metallic nitride material and contacting the semiconductor device and including an annular top surface that contacts the upper contact via structure portion 782B; and a metal fill portion 83 located inside metallic nitride liner 81 and consisting essentially of at least one metallic element.

In one embodiment, the semiconductor structure further comprises: lower level dielectric material layers (i.e., a subset of the layers in the dielectric layer stack 760) located over the silicon nitride layer; lower level metal interconnect structures embedded in the lower level dielectric material layers 764; a planar semiconductor material layer 10 located between the lower level dielectric material layers 760 and the alternating stack (132, 232, 146, 246); a memory level dielectric material portion (165 or 265) overlying the planar semiconductor material layer 10 and located at a level as the alternating stack (132, 232, 146, 246); upper level dielectric material layers (280, 282, 284) located over the alternating stack (132, 232, 146, 246) and the memory level dielectric material portion (165 or 265); and upper level metal interconnect structures (96, 98) embedded in the upper level dielectric material layers (280, 282, 284). The at least one metal interconnect structure (784, 785, 786, 788, 488, 86, 96, 98) comprises at least one of the lower level metal interconnect structures (784, 785, 786, 788), at least one of the upper level metal interconnect structures (96, 98), and a memory level via structure 488 that extends through the memory level dielectric material portion (165 or 265).

In one embodiment, the semiconductor structure further comprises: a terrace region including stepped surfaces of layers of the alternating stack (132, 232, 146, 246); a retro-stepped dielectric material portion (165 or 265) overlying the stepped surfaces and located at levels of the alternating stack (132, 232, 146, 246) and above the at least one second dielectric material layer 768; and a through-dielectric contact via structure 488 vertically extending through the retro-stepped dielectric material portion (165 or 265), the at least one second dielectric material layer 768, and the etch stop silicon nitride layer 766 and contacting a top surface of another lower metal line structure 788 of the lower metal interconnect structures 780. In one embodiment, the through-dielectric contact via structure 488 directly contacts the retro-stepped dielectric material portion (165 or 265) and the at least one second dielectric material layer 768.

In one embodiment, the memory stack structures 55 can comprise memory elements of a vertical NAND device. The electrically conductive layers (146, 246) can comprise, or can be electrically connected to, a respective word line of the vertical NAND device. The substrate 8 can comprises a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising the word line driver circuit and a bit line driver circuit for the memory device. The array of monolithic three-dimensional NAND strings can comprise a plurality of semiconductor channels, wherein at least one end portion (such as a vertical semiconductor channel 60) of each of the plurality of semiconductor channels (59, 11, 60) extends substantially perpendicular to a top surface of the semiconductor substrate 8, a plurality of charge storage elements (as embodied as portions of the memory material layer 54 located at each word line level), each charge storage element located adjacent to a respective one of the plurality of semiconductor channels (59, 11, 60), and a plurality of control gate electrodes (as embodied as a subset of the electrically conductive layers (146, 246) having a strip shape extending substantially parallel to the top surface of the substrate 8 (e.g., along the first horizontal direction hd1), the plurality of control gate electrodes comprise at least a first control gate electrode located in the first device level and a second control gate electrode located in the second device level. Each of the memory stack structures 55 comprises a vertical semiconductor channel 60 and a memory film 50.

Various electrical dopants in the source region 61 and the drain regions 63 are activated by an activation anneal, which is typically conducted at a temperature greater than 950 degrees Celsius. Hydrogen diffusion from the various materials at the level of the three-dimensional memory device (such as from the alternating stack (132, 232, 146, 246) and/or from a TEOS oxide in the retro-stepped dielectric material portions (165, 265)) to the semiconductor devices may adversely impact the performance of the semiconductor devices. The combination of the silicon nitride layer 674 and the upper contact via structure portions 782B blocks diffusion of hydrogen to reduce or prevent degradation of performance of the various semiconductor devices on the substrate 8 during high temperature anneal processes, thereby providing superior performance for the three-dimensional memory device.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
    a semiconductor device located on a semiconductor substrate;
    a silicon nitride layer overlying the semiconductor device;
    a contact via structure extending through the silicon nitride layer, the contact via structure comprising a lower contact via structure portion and an upper contact via structure portion, wherein a top surface of the lower contact via structure portion is located in a horizontal plane located between two horizontal planes containing respective top and bottom surfaces of the silicon nitride layer;
    a three-dimensional memory array overlying the silicon nitride layer, the three-dimensional memory array comprising an alternating stack of insulating layers and electrically conductive layers, and memory stack structures vertically extending through the alternating stack in a memory array region; and
    at least one metal interconnect structure overlying the contact via structure and providing electrical connection between the contact via structure and a node of the three-dimensional memory array.

2. The semiconductor structure of claim 1, wherein:
    a bottom surface of the upper contact via structure contacts the top surface of the lower contact via structure portion;
    the bottom surface of the upper contact via structure is located in the horizontal plane located between the two horizontal planes containing the respective top and bottom surfaces of the silicon nitride layer; and
    a combination of the silicon nitride layer and the upper contact via structure portion function as a hydrogen diffusion barrier.

3. The semiconductor structure of claim 2, wherein the upper contact via structure portion comprises at least one of a metal silicide, titanium nitride and elemental titanium.

4. The semiconductor structure of claim 2, wherein the upper contact via structure portion comprises:
    a diffusion barrier liner consisting essentially of a first metallic diffusion barrier material contacting the lower contact via structure portion; and
    a diffusion barrier material portion consisting essentially of a second metallic diffusion barrier material and embedded within the diffusion barrier liner, wherein a top surface of the upper contact via structure portion includes an annular top surface of the diffusion barrier layer.

5. The semiconductor structure of claim 2, wherein the upper contact via structure portion consists essentially of a single metallic diffusion barrier material.

6. The semiconductor structure of claim 1, further comprising a contact level silicon oxide layer overlying the semiconductor device below the silicon nitride layer, wherein the contact via structure extends through the contact level silicon oxide layer and through the silicon nitride layer.

7. The semiconductor structure of claim 6, wherein:
    the contact level silicon oxide layer has a planar top surface located within a first horizontal plane;
    the silicon nitride layer has a planar top surface located within a second horizontal plane;
    the semiconductor structure further comprises a dielectric cap layer overlying the silicon nitride layer;
    the contact via structure extends through the dielectric cap layer; and
    a top surface of the upper contact via structure portion is within a third horizontal plane including a top surface of the dielectric cap layer.

8. The semiconductor structure of claim 6, wherein:
    the semiconductor device comprises a field effect transistor including a gate electrode overlying a top surface of the semiconductor substrate and two transistor active regions embedded in the semiconductor substrate;
    the semiconductor structure further comprises a planarization dielectric layer overlying the two transistor active regions and laterally surrounding the gate electrode and having a planar top surface, and a planar silicon nitride spacer layer located on the planar top surface of the planarization dielectric layer and overlying the gate electrode and contacting a bottom surface of the contact level silicon oxide layer;
    the contact via structure extends through the planarization dielectric layer and the planar silicon nitride spacer layer; and
    an entire periphery of an interface between the lower contact via structure portion and the upper contact via structure portion is on a sidewall surface of an opening through the silicon nitride layer between an upper periphery of the sidewall surface and a lower periphery of the sidewall surface.

9. The semiconductor structure of claim 8, further comprising:
    a metal silicide portion located within the semiconductor device and contacting a bottom surface of the contact via structure; and
    a substrate capping silicon nitride layer located between the planarization dielectric layer and each of the semiconductor substrate and the gate electrode, wherein the contact via structure extends through the substrate capping silicon nitride layer.

10. The semiconductor structure of claim 1, wherein the lower contact via structure comprises:
    a metallic nitride liner comprising a metallic nitride material and contacting the semiconductor device and including an annular top surface that contacts the upper contact via structure portion; and
    a metal fill portion located inside metallic nitride liner and consisting essentially of at least one metallic element.

11. The semiconductor structure of claim 1, further comprising:
    lower level dielectric material layers located over the silicon nitride layer;
    lower level metal interconnect structures embedded in the lower level dielectric material layers;
    a planar semiconductor material layer located between the lower level dielectric material layers and the alternating stack;
    a memory level dielectric material portion overlying the planar semiconductor material layer and located at levels of the alternating stack;
    upper level dielectric material layers located over the alternating stack and the memory level dielectric material portion; and
    upper level metal interconnect structures embedded in the upper level dielectric material layers, wherein the at least one metal interconnect structure comprises at least one of the lower level metal interconnect structures, at least one of the upper level metal interconnect structures, and a memory level via structure that extends through the memory level dielectric material portion.

12. The semiconductor structure of claim 11, wherein:

the three-dimensional memory array comprises a monolithic three-dimensional NAND memory device;

the electrically conductive layers comprise, or are electrically connected to, a respective word line of the monolithic three-dimensional NAND memory device;

the planar semiconductor material layer comprises a polysilicon layer;

the monolithic three-dimensional NAND memory device comprises an array of monolithic three-dimensional NAND strings over the polysilicon layer;

at least one memory cell in a first device level of the array of monolithic three-dimensional NAND strings is located over another memory cell in a second device level of the array of monolithic three-dimensional NAND strings;

the at least one semiconductor device comprises transistors of an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and each of the memory stack structures comprises a vertical semiconductor channel and a memory film.

* * * * *